(12) United States Patent
Okada et al.

(10) Patent No.: US 10,008,419 B2
(45) Date of Patent: Jun. 26, 2018

(54) SEPARATION METHOD, COMPUTER STORAGE MEDIUM, AND SEPARATION SYSTEM

(75) Inventors: Shinji Okada, Kumamoto (JP); Masatoshi Shiraishi, Kumamoto (JP); Masatoshi Deguchi, Kumamoto (JP); Xavier Francois Brun, Chandler, AZ (US); Charles Wayne Singleton, Jr., Chandler, AZ (US); Kabirkumar Mirpuri, Chandler, AZ (US)

(73) Assignees: Tokyo Electron Limited, Tokyo (JP); INTEL CORPORATION, Santa Clara, CA (US)

( * ) Notice: Subject to any disclaimer, the term of this patent is extended or adjusted under 35 U.S.C. 154(b) by 0 days. days.

(21) Appl. No.: 14/343,598

(22) PCT Filed: Aug. 22, 2012

(86) PCT No.: PCT/JP2012/071750
§ 371 (c)(1),
(2), (4) Date: Jul. 3, 2014

(87) PCT Pub. No.: WO2013/035590
PCT Pub. Date: Mar. 14, 2013

(65) Prior Publication Data
US 2014/0335633 A1 Nov. 13, 2014

(30) Foreign Application Priority Data
Sep. 9, 2011 (JP) .................................. 2011-197705

(51) Int. Cl.
*H01L 21/00* (2006.01)
*H01L 21/66* (2006.01)
(Continued)

(52) U.S. Cl.
CPC ........ *H01L 22/12* (2013.01); *H01L 21/02068* (2013.01); *H01L 21/6715* (2013.01);
(Continued)

(58) Field of Classification Search
None
See application file for complete search history.

(56) References Cited

U.S. PATENT DOCUMENTS

2004/0084145 A1* 5/2004 Pas .................. H01L 21/67207
156/345.11
2005/0028932 A1* 2/2005 Shekel ..................... C23F 1/16
156/345.15
(Continued)

FOREIGN PATENT DOCUMENTS

| JP | H06-275717 A | 9/1994 |
|---|---|---|
| JP | H09-167724 A | 6/1997 |
| JP | 2008-205387 A | 9/2008 |

OTHER PUBLICATIONS

International Search Report and Written Opinion of the International Searching Authority dated Oct. 16, 2012 for the corresponding international application No. PCT/JP2012/071750.

*Primary Examiner* — Alexander Ghyka
(74) *Attorney, Agent, or Firm* — Posz Law Group, PLC

(57) ABSTRACT

A superposed wafer is separated to a processing target wafer and a supporting wafer while being heated. Then, an adhesive on a joint surface of the processing target wafer is removed by supplying an organic solvent onto the joint surface of the processing target wafer. Then, an oxide film formed on the predetermined pattern on the joint surface of the processing target wafer is removed by supplying acetic acid to the joint surface of the processing target wafer. Then, the joint surface of the processing target wafer is inspected. Then, based on an inspection result, the adhesive on the joint surface of the processing target wafer is removed and the
(Continued)

oxide film formed on the predetermined pattern on the joint surface of the processing target wafer is removed.

11 Claims, 19 Drawing Sheets

(51) Int. Cl.
    *H01L 21/67*     (2006.01)
    *H01L 21/02*     (2006.01)
    *H01L 21/683*     (2006.01)

(52) U.S. Cl.
    CPC .. *H01L 21/67017* (2013.01); *H01L 21/67092* (2013.01); *H01L 21/6835* (2013.01); *H01L 2221/6834* (2013.01); *H01L 2221/68327* (2013.01); *H01L 2221/68381* (2013.01); *Y10T 156/1911* (2015.01)

(56) References Cited

U.S. PATENT DOCUMENTS

| | | | | |
|---|---|---|---|---|
| 2008/0026583 A1* | 1/2008 | Hardy | ............... | B24B 37/044 |
| | | | | 438/693 |
| 2010/0112728 A1* | 5/2010 | Korzenski | ......... | H01L 21/02079 |
| | | | | 438/3 |
| 2010/0320081 A1* | 12/2010 | Mayer | ............... | H01L 21/2885 |
| | | | | 204/242 |
| 2011/0297300 A1* | 12/2011 | Furuya | ............... | C09J 183/04 |
| | | | | 156/154 |

* cited by examiner

SEPARATION METHOD, COMPUTER STORAGE MEDIUM, AND SEPARATION SYSTEM

CROSS REFERENCE TO RELATED APPLICATION

The present application is a U.S. national stage of PCT/JP2012/071750 filed on Aug. 22, 2012, and is based on Japanese Patent Application No. 2011-197705 filed on Sep. 9, 2011, the disclosures of which are incorporated herein by reference.

TECHNICAL FIELD

The present invention relates to a separation method of separating a superposed substrate into a processing target substrate and a supporting substrate, a computer storage medium, and a separation system executing the separation method.

BACKGROUND ART

In recent years, for example, in a manufacturing process of a semiconductor device, the diameter of a semiconductor wafer (hereinafter, referred to as a "wafer") increasingly becomes larger. Further, the wafer is required to be thinner in a specific process such as mounting. For example, when a thin wafer with a large diameter is transferred or subjected to polishing as it is, warpage or break can occur in the wafer. Therefore, in order to reinforce the wafer, for example, bonding the wafer to a wafer being a supporting substrate or a glass substrate is performed. The predetermined processing such as polishing and the like are performed on the wafer with the wafer being joined with the supporting substrate as described above, and then the wafer and the supporting substrate are separated.

The separation of the wafer and the supporting substrate is performed using, for example, a separation apparatus. For example, a separation apparatus that directly joins a wafer on which devices are formed to a supporting substrate on which a thermally oxidized film is formed and then separates the wafer is proposed in Patent Document 1. The separation apparatus has, for example, a first holder that holds the wafer, a second holder that holds the supporting substrate, and a nozzle that jets liquid between the wafer and the supporting substrate. Then, this separation apparatus separates the wafer and the supporting substrate by jetting liquid between the joined wafer and supporting substrate, namely, to the joint surfaces of the wafer and the supporting substrate from a nozzle at a jetting pressure greater than the joint strength between the wafer and the supporting substrate, preferably, a jetting pressure twice or greater than the joint strength.

PATENT DOCUMENT

Japanese Laid-open Patent Publication No. H9-167724

DISCLOSURE OF THE INVENTION

Problems to be Solved by the Invention

Incidentally, methods of joining the wafer and the supporting substrate includes a method of joining the supporting substrate and the wafer with an adhesive intervening between them and so on as well as the method of directly joining the wafer to the supporting substrate on which the thermally oxidized film is formed as disclosed, for example, in Patent Document 1.

When performing the joint using the adhesive, it is necessary to soften the adhesive intervening between the wafer and the supporting substrate in separating the wafer and the supporting substrate. For this reason, when separating the wafer and the supporting substrate, heat processing on the joined wafer and supporting substrate is performed in order to soften the adhesive.

However, heating processing performed on the wafer causes formation of an oxide film on the exposed surface of the wafer, namely, predetermined patterns (devices) exposed on the wafer, in particular, bumps made of metal such as copper. Then, the oxide film may hinder the predetermined patterns from carrying out its function and seriously damage a product.

The present invention has been made in consideration of the above point, and an object thereof is to suppress an oxide film to be formed on a predetermined pattern on the surface of a processing target substrate in separation processing of a processing target substrate and a supporting substrate.

Means for Solving the Problems

To achieve the above object, the present invention is a separation method of separating a superposed substrate in which a processing target substrate and a supporting substrate are joined together with an adhesive, to the processing target substrate and the supporting substrate, the separation method including: a separation step of separating the superposed substrate to the processing target substrate and the supporting substrate while heating the superposed substrate; an adhesive removing step of removing the adhesive on a surface of the processing target substrate thereafter by supplying an organic solvent to the surface of the processing target substrate separated in the separation step; and an oxide film removing step of removing an oxide film formed on a predetermined pattern on the surface of the processing target substrate thereafter by supplying acid to the surface of the processing target substrate from which the adhesive has been removed in the adhesive removing step. Note that the predetermined pattern in the present invention has a bump made of metal such as copper.

According to the present invention, a superposed substrate is separated to a processing target substrate and a supporting substrate in a separation step, an adhesive on the surface of the processing target substrate is removed in a subsequent adhesive removing step, and then acid is supplied to the surface of the processing target substrate in an oxide film removing step. Therefore, even if an oxide film is formed on a predetermined pattern on the surface of the processing target substrate, for example, in the separation step, the oxide film on the predetermined pattern can be removed with the acid supplied in the oxide film removing step. This enables appropriate manufacture of products.

The present invention in another aspect is a computer-readable storage medium storing a program operating on a computer of a control unit controlling a separation system to cause the separation system to execute a separation method of separating a superposed substrate in which a processing target substrate and a supporting substrate are joined together with an adhesive, to the processing target substrate and the supporting substrate, the separation method including: a separation step of separating the superposed substrate to the processing target substrate and the supporting substrate while heating the superposed substrate; an adhesive removing step of removing the adhesive on a surface of the processing target substrate thereafter by supplying an organic solvent to the surface of the processing target substrate separated in the separation step; and an oxide film removing step of removing an oxide film formed on a predetermined pattern on the surface of the processing target substrate thereafter by supplying acid to the surface of the processing target substrate from which the adhesive has been removed in the adhesive removing step.

The present invention in still another aspect is a separation system that separates a superposed substrate in which a processing target substrate and a supporting substrate are joined together with an adhesive, to the processing target substrate and the supporting substrate, including: a separation apparatus that separates the superposed substrate to the processing target substrate and the supporting substrate while heating the superposed substrate; a solvent supplying unit that removes the adhesive on a surface of the processing target substrate by supplying an organic solvent to the surface of the processing target substrate separated by the separation apparatus; and an acid supplying unit that removes an oxide film formed on a predetermined pattern on the surface of the processing target substrate by supplying acid to the surface of the processing target substrate from which the adhesive has been removed by the solvent supplying unit.

Effect of the Invention

According to the present invention, it is possible to suppress an oxide film formed on a predetermined pattern on the surface of a processing target substrate in separation processing of a processing target substrate and a supporting substrate.

BEST MODE FOR CARRYING OUT THE INVENTION

Figure 1:
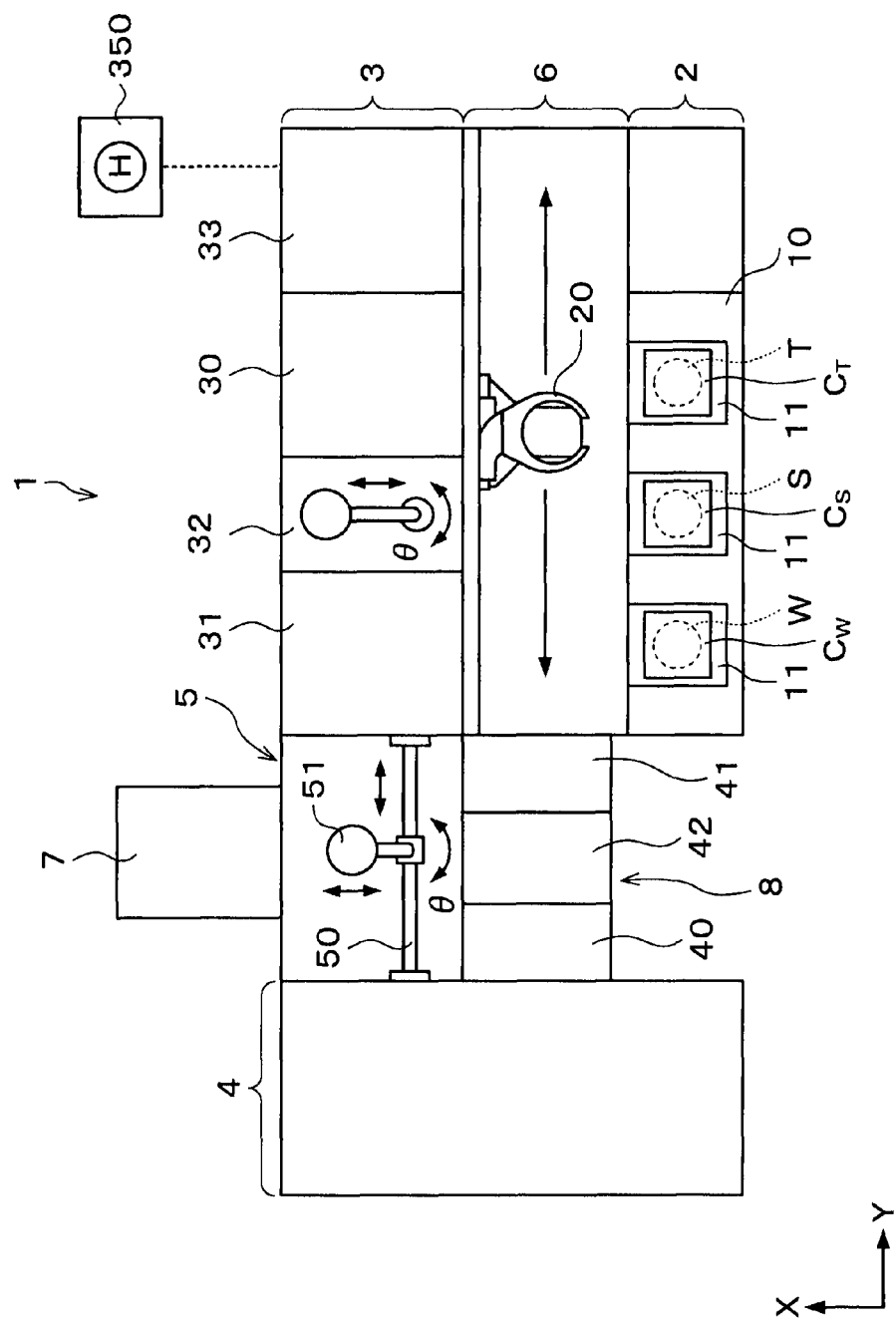
FIG. 1 A plan view illustrating the outline of a configuration of a separation system according to this embodiment.

Hereinafter, embodiments of the present invention will be described. FIG. 1 is a plan view illustrating the outline of a configuration of a separation system 1 according to this embodiment.

Figure 2:
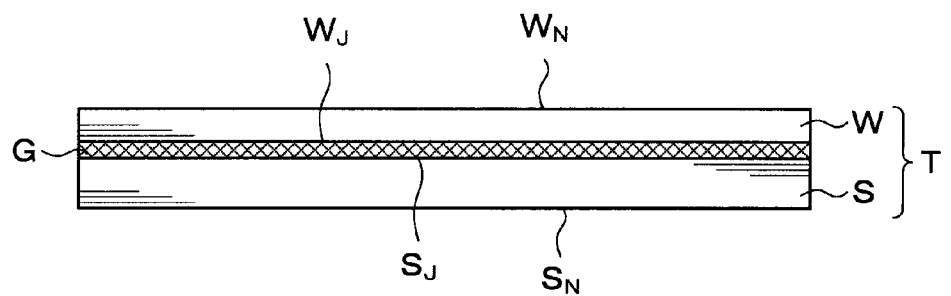
FIG. 2 A side view of a processing target wafer and a supporting wafer.

In the separation system 1, a superposed wafer T as a superposed substrate in which a processing target wafer W as a processing target substrate and a supporting wafer S as a supporting substrate are joined together with an adhesive G as illustrated in FIG. 2 is separated into the processing target wafer W and the supporting wafer S. Hereinafter, in the processing target wafer W, the surface to be joined with the supporting wafer S via the adhesive G is referred to as a "joint surface $W_J$" and the surface opposite to the joint surface $W_J$ is referred to as "a non-joint surface $W_N$." Similarly, in the supporting wafer S, the surface to be joined with the processing target wafer W via the adhesive U is referred to as a "joint surface $S_J$" and the surface opposite to the joint surface $S_J$ is referred to as "a non-joint surface $S_N$."

Note that the processing target wafer W is a wafer which will be a product, and a plurality of devices (predetermined patterns) have been formed, for example, on the joint surface $W_J$. The predetermined patterns have bumps made of metal such as copper. Further, in the processing target wafer W, for example, the non-joint surface $W_N$ has been subjected to polishing to be thinned (for example, with a thickness of 50 μm to 100 μm). The supporting wafer S is a wafer which has the same diameter as that of the processing target wafer W and supports the processing target wafer W. Note that a case of using a wafer as the supporting substrate will be described in this embodiment, but other substrates such as, for example, a glass substrate and the like may be used.

The separation system 1 has, as illustrates in FIG. 1, a configuration in which a transfer-in/out station 2 into/from which cassettes $C_W$, $C_S$, $C_T$ capable of housing a plurality of processing target wafers W, a plurality of supporting wafers S, and a plurality of superposed wafers T respectively are transferred from/to the outside, a separation processing station 3 including various processing and treatment apparatuses that perform predetermined processing and treatment on the processing target wafer W, the supporting wafer S, and the superposed wafer T, and an interface station 5 that delivers the processing target wafer W to/from a post-processing station 4 adjacent to the separation processing station 3, are integrally connected.

The transfer-in/out station 2 and the separation processing station 3 are arranged side by side in an X-direction (a top-bottom direction in FIG. 1). Between the transfer-in/out station 2 and the separation processing station 3, a wafer transfer region 6 is formed. The interface station 5 is located on a Y-direction negative direction side (a left direction side in FIG. 1) of the separation processing station 3. On an X-direction positive direction side (an upper direction side in FIG. 1) of the interface station 5, an inspection apparatus 7 that inspects the processing target wafer W before being delivered to the post-processing station 4 is disposed. Further, on the opposite to the inspection apparatus 7 across the interface station 5, namely, on an X-direction negative direction side (a lower direction side in FIG. 1) of the interface station 5, a post-inspection cleaning station 8 that cleans the joint surface $W_J$ and the non-joint surface $W_N$ of the processing target wafer W after inspection and reverses the front and rear surfaces of the processing target wafer W is disposed.

In the transfer-in/out station 2, a cassette mounting table 10 is provided. On the cassette mounting table 10, a plurality of, for example, three cassette mounting plates 11 are provided. The cassette mounting plates 11 are arranged side by side in a line in a Y-direction (a right-left direction in FIG. 1). On these cassette mounting plates 11, the cassettes $C_W$, $C_S$, $C_T$ can be mounted when the cassettes $C_W$, $C_S$, $C_T$ are transferred in/out from/to the outside of the separation system 1. As described above, the transfer-in/out station 2 is configured to be capable of holding the plurality of processing target wafers W, the plurality of supporting wafers S, and the plurality of superposed wafers T. Note that the number of cassette mounting plates 11 is not limited to this embodiment but can be arbitrarily determined. Further, the plurality of superposed wafers T transferred into the transfer-in/out station 2 have been subjected to inspection in advance and discriminated between a superposed wafer T including a normal processing target wafer W and a superposed wafer T including a defective processing target wafer W.

In the wafer transfer region 6, a first transfer apparatus 20 is disposed. The first transfer apparatus 20 has, for example, a transfer arm that is movable, for example, in the vertical direction, the horizontal directions (the X-direction, the Y-direction), and around the vertical axis. The first transfer apparatus 20 can move in the wafer transfer region 6 and transfer the processing target wafer W, the supporting wafer S, the superposed wafer T between the transfer-in/out station 2 and the separation processing station 3.

The separation processing station 3 has a separation apparatus 30 that separates the superposed wafer T into the processing target wafer W and the supporting wafer S. On the Y-direction negative direction side (the left direction side in FIG. 1) of the separation apparatus 30, a first cleaning apparatus 31 that cleans the separated processing target wafer W is disposed. Between the separation apparatus 30 and the first cleaning apparatus 31, a second transfer apparatus 32 is provided. Further, on the Y-direction positive direction side (the right direction side in FIG. 1) of the separation apparatus 30, a second cleaning apparatus 33 that cleans the separated supporting wafer S is disposed. As described above, in the separation processing station 3, the first cleaning apparatus 31, the second transfer apparatus 32, the separation apparatus 30, and the second cleaning apparatus 33 are arranged side by side in this order from the interface station 5 side.

The inspection apparatus 7 inspects the presence or absence of a residue of the adhesive G on the processing target wafer W separated by the separation apparatus 30, and the presence or absence of a residue of an oxide film formed on the predetermined patterns, in particular, the bumps on the joint surface $W_J$ of the processing target wafer W. Further, the post-inspection cleaning station 8 cleans the processing target wafer W for which a residue of the adhesive G and a residue of the oxide film have been checked in the inspection apparatus 7. The post-inspection cleaning station 8 has a joint surface cleaning apparatus 40 that cleans the joint surface $W_J$ of the processing target wafer W, a non-joint surface cleaning apparatus 41 that cleans the non-joint surface $W_N$ of the processing target wafer W, and a reversing apparatus 42 that reverses the front and rear surfaces of the processing target wafer W. The joint surface cleaning apparatus 40, the non-joint surface cleaning apparatus 41, and the reversing apparatus 42 are arranged side by side in the Y-direction from the post-processing station 4 side.

In the interface station 5, a third transfer apparatus 51 which is movable on a transfer path 50 that extends in the Y-direction is provided. The third transfer apparatus 51 is also movable in the vertical direction and around the vertical axis (in a θ-direction), and thus can transfer the processing target wafer W between the separation processing station 3, the post-processing station 4, the inspection apparatus 7, and the post-inspection cleaning station 8.

Note that in the post-processing station 4, predetermined post-processing is performed on the processing target wafer W separated in the separation processing station 3. As the predetermined post-processing, for example, processing of mounting the processing target wafer W, processing of performing inspection of electric characteristics of the devices on the processing target wafer W, processing of dicing the processing target wafer W into chips are performed.

Figure 3:
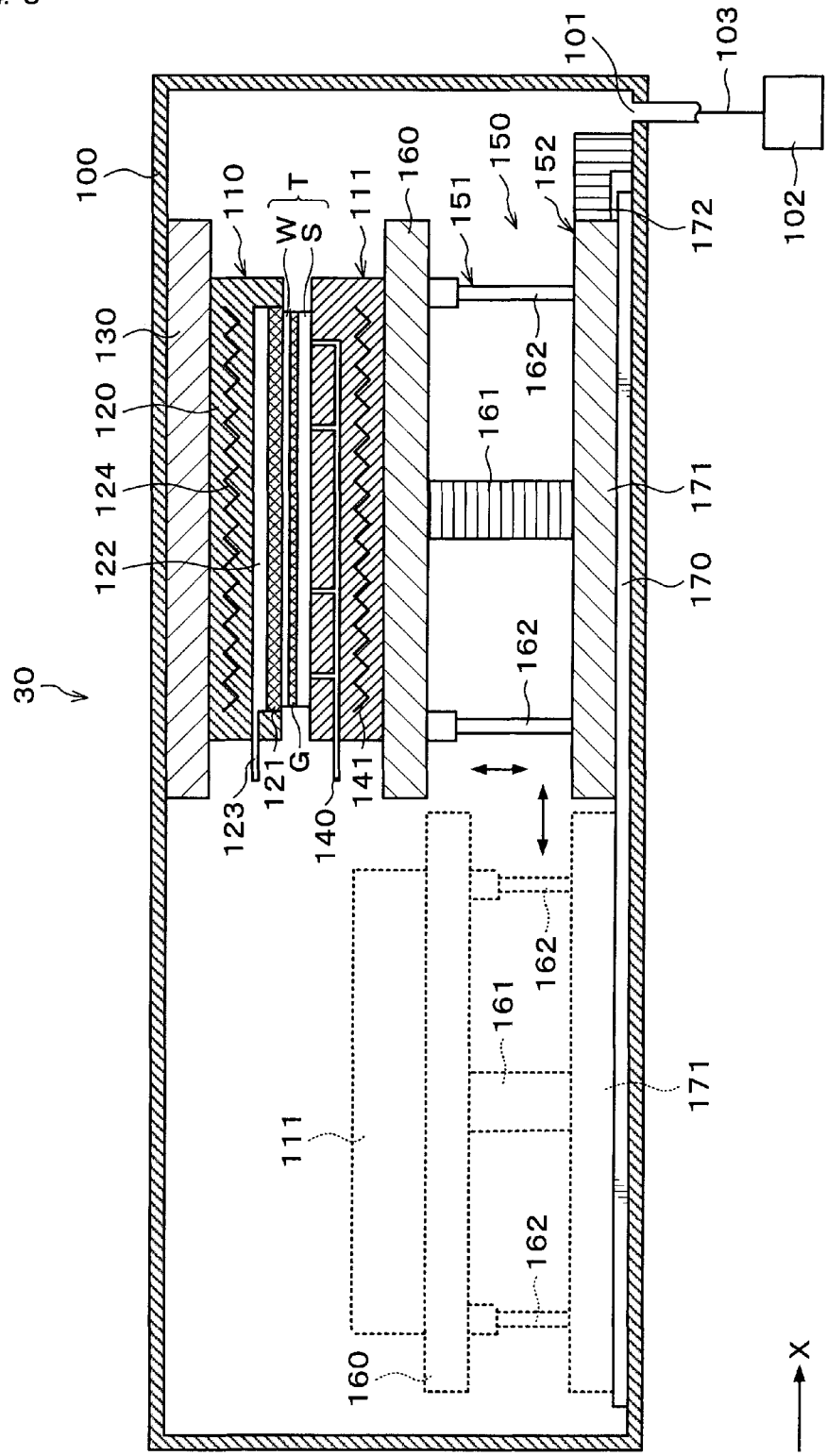
FIG. 3 A longitudinal sectional view illustrating the outline of a configuration of a separation apparatus.

Next, the configuration of the above-described separation apparatus 30 will be described. The separation apparatus 30 has a processing container 100 in which a plurality of devices are housed as illustrated in FIG. 3. In the side surface of the processing container 100, a transfer-in/out port (not illustrated) for the processing target wafer W, the supporting wafer S, and the superposed wafer T is formed, and an opening/closing shutter (not illustrated) is provided at the transfer-in/out port. Note that the processing container 100 in this embodiment is composed of for example, a thin plate made of stainless steel or the like and does not hermetically close the inside thereof, but the processing container 100 is not limited in structure to this embodiment, but may be an airtight container which can hermetically close the inside thereof.

At the bottom surface of the processing container 100, an exhaust port 101 exhausting the atmosphere in the processing container 100 is formed. An exhaust pipe 103 communicating with an exhaust apparatus 102 such as, for example, a vacuum pump is connected to the exhaust port 101.

Inside the processing container 100, a first holding unit 110 that suction-holds the processing target wafer W by its lower surface, and a second holding unit 111 that mounts and holds the supporting wafer S on its upper surface are provided. The first holding unit 110 is provided above the second holding unit 111 and disposed to face the second holding unit 111. In other words, inside the processing container 100, the separation processing is performed on the superposed wafer T with the processing target wafer W arranged on the upper side and the supporting wafer S arranged on the lower side.

For the first holding unit 110, for example, a porous chuck is used. The first holding unit 110 has a main body unit 120 in a flat plate shape. On the lower surface side of the main body unit 120, a porous 121 being a porous body is provided. The porous 121 has, for example, substantially the same diameter as that of the processing target wafer W and is in abutment with the non-joint surface $W_N$ of the processing target wafer W. Note that as the porous 121, for example, silicon carbide is used.

Further, a suction space 122 is formed inside the main body unit 120 and above the porous 121. The suction space 122 is formed, for example, in a manner to cover the porous 121. To the suction space 122, a suction pipe 123 is connected. The suction pipe 123 is connected to a negative pressure generating apparatus (not illustrated) such as, for example, a vacuum pump. Then, the non-joint surface $W_N$ of the processing target wafer is sucked from the suction pipe 123 via the suction space 122 and the porous 121 so that the processing target wafer W is suction-held by the first holding unit 110.

Further, inside the main body unit 120 and above the suction space 122, a heating mechanism 124 heating the processing target wafer W is provided. For the heating mechanism 124, for example, a heater is used.

On the upper surface of the first holding unit 110, a supporting plate 130 that supports the first holding unit 110 is provided. The supporting plate 130 is supported on the ceiling surface of the processing container 100. Note that the supporting plate 130 in this embodiment may be omitted so that the first holding unit 110 is supported in abutment with the ceiling surface of the processing container 100.

Inside the second holding unit 111, a suction pipe 140 for suction-holding the supporting wafer S is provided. The suction pipe 140 is connected to a negative pressure generating apparatus (not illustrated) such as, for example, a vacuum pump.

Further, inside the second holding unit 111, a heating mechanism 141 heating the supporting wafer S is provided. For the heating mechanism 141, for example, a heater is used.

Below the second holding unit 111, a moving mechanism 150 that moves the second holding unit 111 and the supporting wafer S in the vertical direction and the horizontal direction is provided. The moving mechanism 150 has a vertical moving unit 151 that moves the second holding unit 111 in the vertical direction and a horizontal moving unit 152 that moves the second holding unit 111 in the horizontal direction.

The vertical moving unit 151 has a supporting plate 160 that supports the lower surface of the second holding unit 111, a driving unit 161 that raises and lowers the supporting plate 160 to cause the first holding unit 110 and the second holding unit 111 to approach to and separate from each other in the vertical direction, and supporting members 162 that support the supporting plate 160. The driving unit 161 has, for example, a ball screw (not illustrated) and a motor (not illustrated) that turns the ball screw. Further, the supporting members 162 are configure to be capable of expansion and contraction in the vertical direction, and provided, for example, at three locations between the supporting plate 160 and a later-described supporting body 171.

The horizontal moving unit 152 has a rail 170 that extends along an X-direction (a right-left direction in FIG. 3), the supporting body 171 attached to the rail 170, and a driving unit 172 that moves the supporting body 171 along the rail 170. The driving unit 172 has, for example, a ball screw (not illustrated) and a motor (not illustrated) that turns the ball screw.

Note that below the second holding unit 111, raising and lowering pins (not illustrated) for supporting the superposed wafer T or the supporting wafer S from below and raising and lowering it are provided. The raising and lowering pins are configured to be able to pass through through holes (not illustrated) formed in the second holding unit 111 and project from the upper surface of the second holding unit 111.

Figure 4:
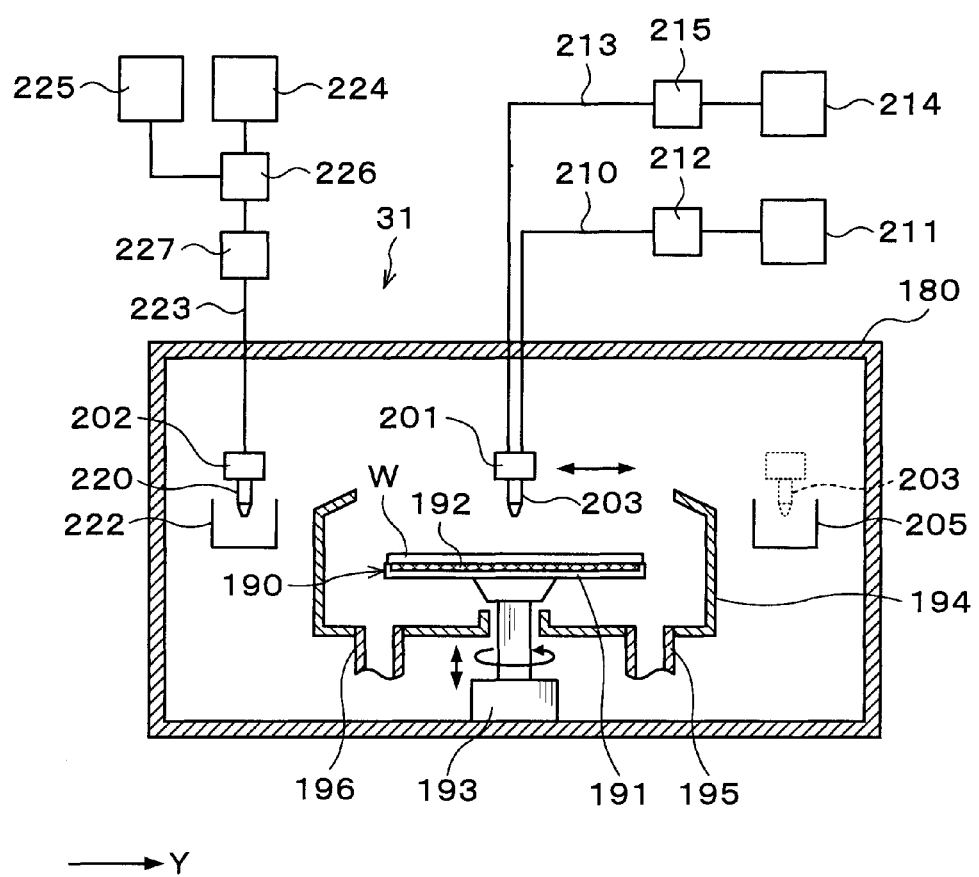
FIG. 4 A longitudinal sectional view illustrating the outline of a configuration of a first cleaning apparatus.

Next, the configuration of the above-described first cleaning apparatus 31 will be described. The first cleaning apparatus 31 has a treatment container 180 as illustrated in FIG. 4. In a side surface of the treatment container 180, a transfer-in/out port (not illustrated) for the processing target wafer W is formed, and an opening/closing shutter (not illustrated) is provided at the transfer-in/out port.

At a central portion inside the treatment container 180, a porous chuck 190 that mounts and rotates the processing target wafer W thereon is provided. The porous chuck 190 has a main body unit 191 in a flat plate shape and a porous 192 being a porous body provided on the upper surface side of the main body unit 191. The porous 192 has, for example, substantially the same diameter as that of the processing target wafer W and is in abutment with the non-joint surface $W_N$ of the processing target wafer W. Note that as the porous 192, for example, silicon carbide is used. A suction pipe (not illustrated) is connected to the porous 192 and sucks the non-joint surface $W_N$ of the processing target wafer W from the suction pipe via the porous 192 and thereby can suction-hold the processing target wafer W on the porous chuck 190.

Below the porous chuck 190, a chuck driving unit 193 equipped with, for example, a motor is provided. The porous chuck 190 can rotate at a predetermined speed by means of the chuck driving unit 193. Further, the chuck driving unit 193 is provided with a raising and lowering driving source such as, for example, a cylinder so that the porous chuck 190 can freely rise and lower.

Around the porous chuck 190, a cup 194 is provided as a recovery unit that receives and recovers liquid splashing or dropping from the processing target wafer W. A later-described solvent drain pipe 195 that drains a waste solution of an organic solvent and a later-described acetic acid drain pipe 196 that drains a waste solution of an acetic acid are connected to the lower surface of the cup 194. Note that an exhaust pipe (not illustrates) that vacuums and exhausts the atmosphere in the cup 194 is also connected to the lower surface of the cup 194.

Figure 5:
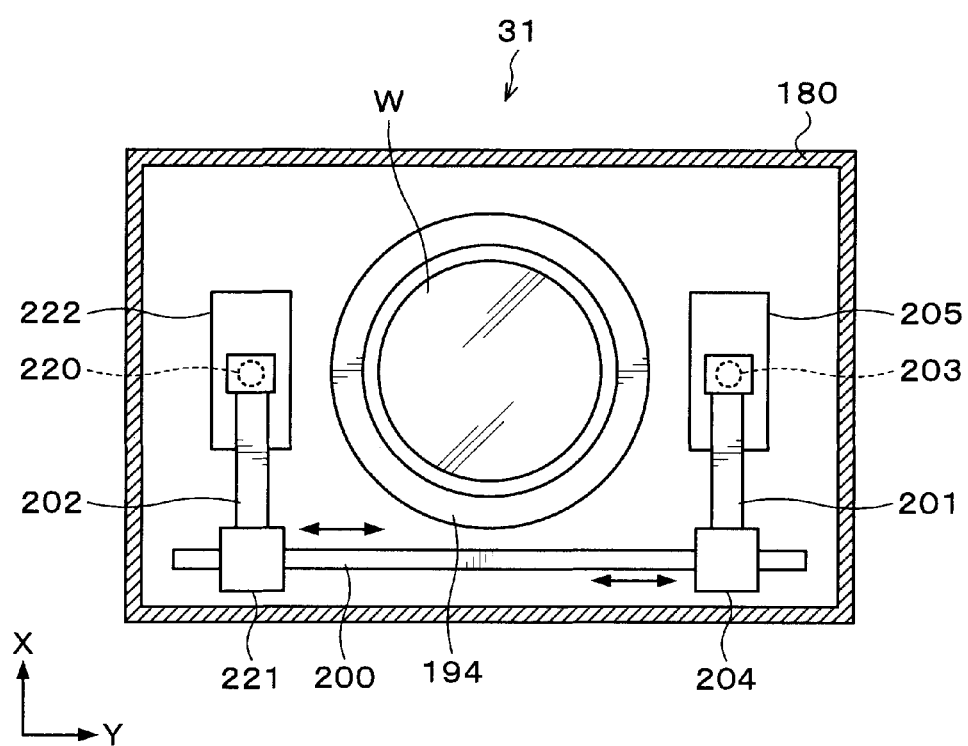
FIG. 5 A transverse sectional view illustrating the outline of the configuration of the first cleaning apparatus.

As illustrated in FIG. 5, on an X-direction negative direction (a downward direction in FIG. 5) side of the cup 194, a rail 200 that extends along a Y-direction (a right-left direction in FIG. 5) is formed. The rail 200 is formed, for example, from a Y-direction negative direction (a left direction in FIG. 5) side outer position of the cup 194 to a Y-direction positive direction (a right direction in FIG. 5) side outer position. On the rail 200, for example, two arms 201, 202 are attached.

On the first arm 201, a solvent nozzle 203 as a solvent supplying unit that supplies a solvent for the adhesive G being the cleaning solution for the adhesive G, for example, an organic solvent onto the processing target wafer W is supported as illustrated in FIG. 4 and FIG. 5. The first arm 201 is movable on the rail 200 by means of a nozzle driving unit 204 illustrated in FIG. 5. Thus, the solvent nozzle 203 can move from a waiting section 205 provided at the Y-direction positive direction side outer position of the cup 194 to a position above a central portion of the processing target wafer W in the cup 194, and further move in the diameter direction of the processing target wafer W above the processing target wafer W. Further, the first arm 201 can freely rise and lower by means of the nozzle driving unit 204 to be able to adjust the height of the solvent nozzle 203.

For the solvent nozzle 203, for example, a two-fluid nozzle is used. To the solvent nozzle 203, a supply pipe 210 that supplies the organic solvent to the solvent nozzle 203 is connected as illustrated in FIG. 4. The supply pipe 210 communicates with a solvent supply source 211 that stores the organic solvent therein. Along the supply pipe 210, a supply equipment group 212 is provided which includes a valve, a flow regulator and so on that control the flow of the organic solvent. Further, a supply pipe 213 that supplies an inert gas, for example, a nitrogen gas to the solvent nozzle 203 is connected to the solvent nozzle 203. The supply pipe 213 communicates with a gas supply source 214 that stores the inert gas therein. Along the supply pipe 213, a supply equipment group 215 is provided which includes a valve, a flow regulator and so on that control the flow of the inert gas. Then, the organic solvent and the inert gas are mixed in the solvent nozzle 203 and supplied from the solvent nozzle 203 to the processing target wafer W. Note that the mixture of the organic solvent and the inert gas is sometimes referred to simply as an "organic solvent" hereinafter.

On the second arm 202, an acetic acid nozzle 220 as an acetic acid supplying unit that supplies acetic acid that is acid in a liquid state is supported. The second arm 202 is movable on the rail 200 by means of a nozzle driving unit 221 illustrated in FIG. 5. Thus, the acetic acid nozzle 220 can move from a waiting section 222 provided at the Y-direction negative direction side outer position of the cup 194 to a position above a central portion of the processing target wafer W in the cup 194, and further move in the diameter direction of the processing target wafer W above the processing target wafer W. Further, the second arm 202 can freely rise and lower by means of the nozzle driving unit 221 to be able to adjust the height of the acetic acid nozzle 220.

To the acetic acid nozzle 220, a supply pipe 223 that supplies the acetic acid to the acetic acid nozzle 220 is connected as illustrated in FIG. 4. The supply pipe 223 communicates with an acetic acid supply source 224 that stores acetic acid with a concentration of 100% therein and a pure water supply source 225 that stores pure water therein. Along the supply pipe 223, a mixer 226 is provided which mixes the acetic acid supplied from the acetic acid supply source 224 and the pure water supplied from the pure water supply source 225. In this mixer 226, the acetic acid with a concentration of 100% and the pure water are mixed to generate a solution of acetic acid with a predetermined concentration, for example, a concentration of 70%. Note that the solution of acetic acid with a concentration of 70% made by mixing the acetic acid with a concentration of 100% and the pure water is sometimes referred to simply as "acetic acid." Further, along the supply pipe 223, a supply equipment group 227 that includes a valve, a flow regulator and so on that control the flow of the acetic acid is provided downstream of the mixer 226.

Incidentally, below the porous chuck 190, raising and lowering pins (not illustrated) for supporting the processing target wafer W from below and raising and lowering it may be provided. In this case, the raising and lowering pins are configured to be able to pass through through holes (not illustrated) formed in the porous chuck 190 and project from the upper surface of the porous chuck 190. Then, in place of raising and lowering the porous chuck 190, the raising and lowering pins are raised or lowered to deliver the processing target wafer W to/from the porous chuck 190.

Note that the aforementioned joint surface cleaning apparatus 40 and non-joint surface cleaning apparatus 41 in the post-inspection cleaning station 8 have the same configuration as that of the first cleaning apparatus 31, and therefore the description thereof is omitted. Further, the acetic acid nozzles 220 in the joint surface cleaning apparatus 40 and the non-joint surface cleaning apparatus 41 constitute another acid supplying unit in the present invention. Since the predetermined patterns being the devices are not formed on the non-joint surface $W_N$ of the processing target wafer W in this embodiment, no oxide film is formed on the bumps on the non-joint surface $W_N$. However, in the case where the oxide film is formed on the non-joint surface $W_N$ itself, the acetic acid nozzles 220 and its accompanying members 221 to 227 in the non-joint surface cleaning apparatus 41 are useful in removing the oxide film. Further, the predetermined patterns being the devices are sometimes formed also on the non-joint surface of the processing target wafer in a specific product. In this case, the acetic acid nozzles 220 and its accompanying members 221 to 227 in the non-joint surface cleaning apparatus 41 are useful in removing the oxide film formed on the bumps of the predetermined patterns.

Figure 6:
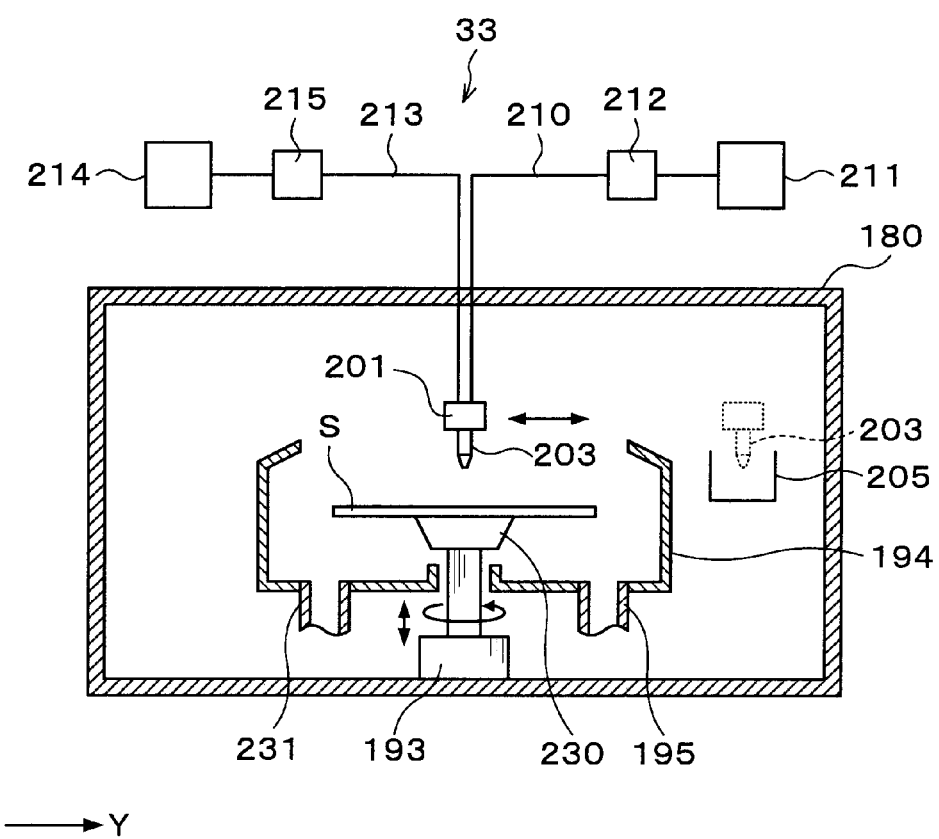
FIG. 6 A longitudinal sectional view illustrating the outline of a configuration of a second cleaning apparatus.

Further, the configuration of the second cleaning apparatus 33 is substantially the same as the configuration of the above-described first cleaning apparatus 31. In the second cleaning apparatus 33, a spin chuck 230 is provided as illustrated in FIG. 6 in place of the porous chuck 190 of the first cleaning apparatus 31. The spin chuck 230 has a horizontal upper surface, and a suction port (not illustrated) for sucking, for example, the supporting wafer S is provided in the upper surface. By suction through the suction port, the supporting wafer S can be suction-held on the spin chuck 230. The second cleaning apparatus 33 has a configuration in which the acetic acid nozzle 220 and its accompanying members 221 to 227 in the first cleaning apparatus 31 are omitted. Further, to the cup 194 of the second cleaning apparatus 33, an exhaust pipe 231 that vacuums and exhausts the atmosphere in the cup 194 is connected while the acetic acid drain pipe 196 in the first cleaning apparatus 31 is omitted. The other configuration of the second cleaning apparatus 33 is the same as that of the above-described first cleaning apparatus 31, and therefore the description thereof is omitted.

Incidentally, in the second cleaning apparatus 33, a back rinse nozzle (not illustrated) that jets a cleaning solution toward the rear surface of the supporting wafer S, namely, the non-joint surface $S_N$ may be provided below the spin chuck 230. The cleaning solution jetted from the hack rinse nozzle cleans the non-joint surface $S_N$ of the supporting wafer S and the outer peripheral portion of the supporting wafer S.

Figure 7:
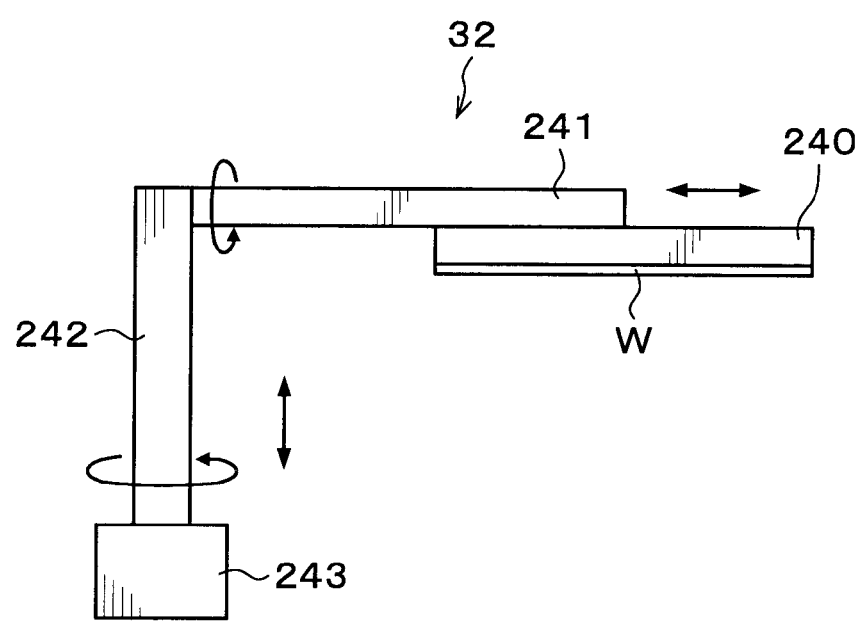
FIG. 7 A side view illustrating the outline of a configuration of a second transfer apparatus.

Next, the configuration of the above-described second transfer apparatus 32 will be described. The second transfer apparatus 32 has a Bernoulli chuck 240 that holds the processing target wafer W as illustrated in FIG. 7. The Bernoulli chuck 240 is supported by a supporting arm 241. The supporting arm 241 is supported by a first driving unit 242. By means of the first driving unit 242, the supporting arm 241 can turn around the horizontal axis and expand and contract in the horizontal direction. Below the first driving unit 242, a second driving unit 243 is provided. By means of the second driving unit 243, the first driving unit 242 can rotate around the vertical axis and rise and lower in the vertical direction.

Note that the third transfer apparatus 51 has the same configuration as that of the above-described second transfer apparatus 32, and therefore the description thereof is omitted. However, the second driving unit 232 of the third transfer apparatus 51 is attached to the transfer path 50 illustrated in FIG. 1 so that the third transfer apparatus 51 is movable on the transfer path 50.

Figure 8:
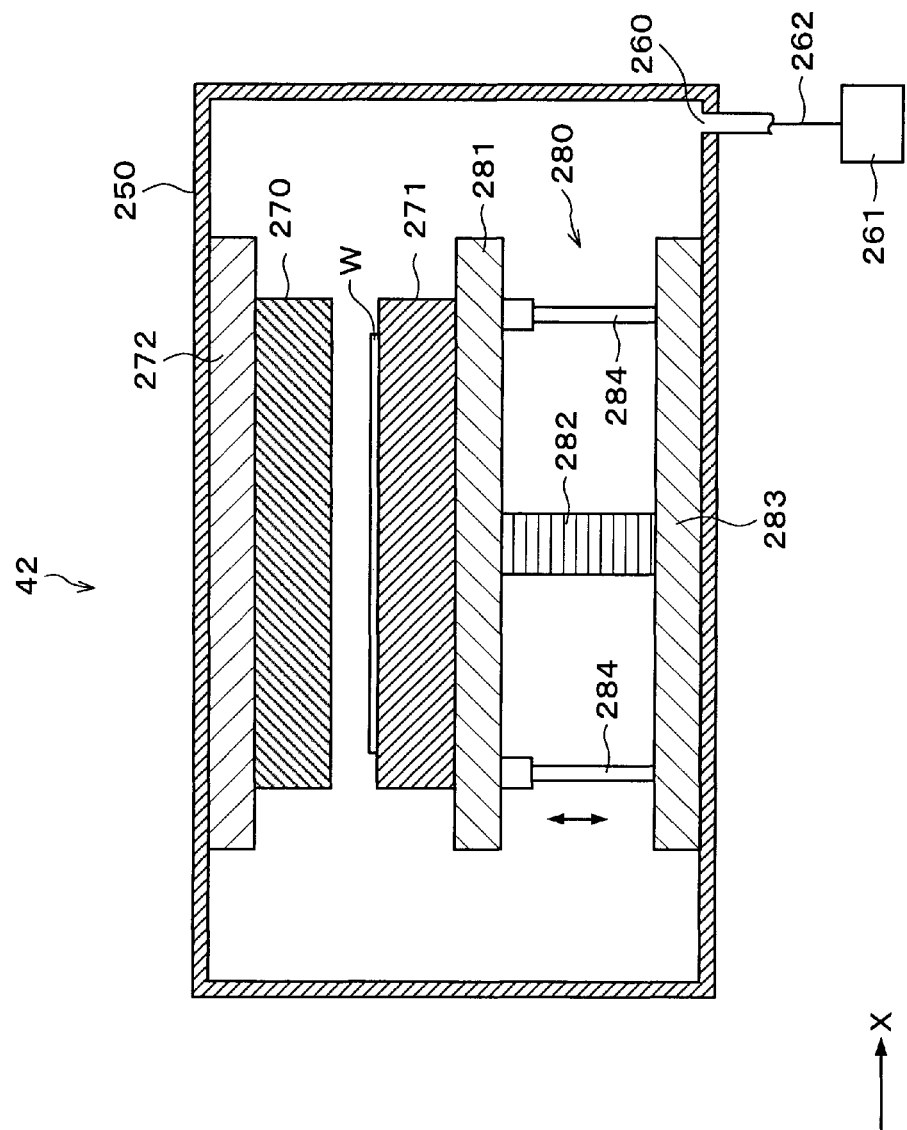
FIG. 8 A longitudinal sectional view illustrating the outline of a configuration of a reversing apparatus.

Next, the configuration of the aforementioned reversing apparatus 42 will be described. The reversing apparatus 42 has a processing container 250 housing a plurality of devices therein as illustrated in FIG. 8. In a side surface of the processing container 250, a transfer-in/out port (not illustrated) is formed for transferring in/out the processing target wafer W by the third transfer apparatus 51, and an opening/closing shutter (not illustrated) is provided at the transfer-in/out port.

At the bottom surface of the processing container 250, an exhaust port 260 that exhausts the atmosphere in the processing container 250 is formed. To the exhaust port 260, an exhaust pipe 262 is connected which communicating with an exhaust apparatus 261 such as a vacuum pump.

Inside the processing container 250, a first holding unit 270 that holds the processing target wafer W on its lower surface and a second holding unit 271 that holds the processing target wafer W on its upper surface are to provided. The first holding unit 270 is provided above the second holding unit 271 and disposed to face the second holding unit 271. The first holding unit 270 and the second holding unit 271 have substantially the same diameter as that of, for example, the processing target wafer W. For the first holding unit 270 and the second holding unit 271, Bernoulli chucks are used. This enables each of the first holding unit 270 and the second holding unit 271 to hold the whole one surface of the processing target wafer W in a non-contact manner.

On the upper surface of the first holding unit 270, a supporting plate 272 that supports the first holding unit 270 is provided. Note that the supporting plate 272 in this embodiment may be omitted so that the first holding unit 270 is supported in abutment with the ceiling surface of the processing container 250.

Below the second holding unit 271, a moving mechanism 280 that moves the second holding unit 271 in the vertical direction is provided. The moving mechanism 280 has a supporting plate 281 that supports the lower surface of the second holding unit 271 and a driving unit 282 that raises and lowers the supporting plate 281 to cause the first holding unit 270 and the second holding unit 271 to approach to and separate from each other in the vertical direction. The driving unit 282 is supported by a supporting body 283 provided at the bottom surface of the processing container 250. Further, a supporting member 284 that supports the supporting plate 281 is provided on the upper surface of the supporting body 283. The supporting member 284 is configured to be capable of expansion and contraction in the vertical direction and to be able to freely expand and contact when the driving unit 282 raises and lowers the supporting plate 281.

Figure 9:
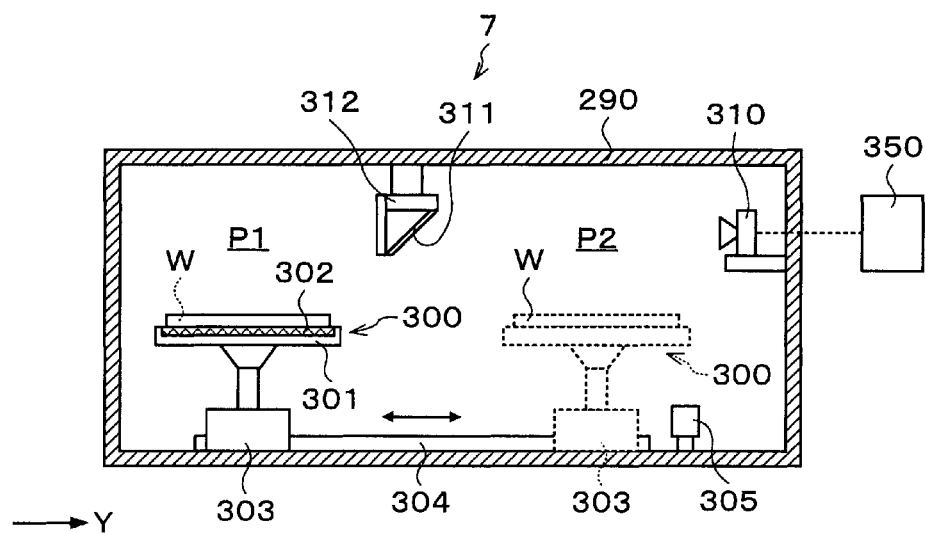
FIG. 9 A longitudinal sectional view illustrating the outline of a configuration of an inspection apparatus.
Figure 10:
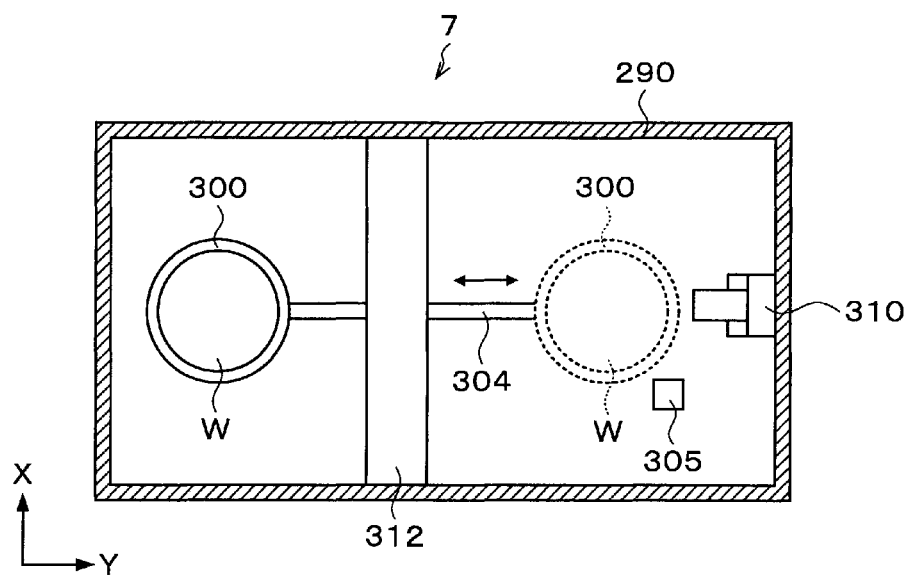
FIG. 10 A transverse sectional view illustrating the outline of the configuration of the inspection apparatus.

Next, the configuration of the aforementioned inspection apparatus 7 will be described. The inspection apparatus 7 has a processing container 290 as illustrated in FIG. 9 and FIG. 10. In a side surface of the processing container 290, a transfer-in/out port (not illustrated) for the processing target wafer W is formed, and an opening/closing shutter (not illustrated) is provided at the transfer-in/out port.

Inside the processing container 290, a porous chuck 300 that holds the processing target wafer W thereon is provided. The porous chuck 300 has a main body unit 301 in a flat plate shape and a porous 302 being a porous body provided on the upper surface side of the main body unit 301. The porous 302 has, for example, substantially the same diameter as that of the processing target wafer W and is in abutment with the non-joint surface $W_N$ of the processing target wafer W. Note that as the porous 302, for example, silicon carbide is used. A suction pipe (not illustrated) is connected to the porous 302 and sucks the non-joint surface $W_N$ of the processing target wafer W from the suction pipe via the porous 302 and thereby can suction-hold the processing target wafer W on the porous chuck 300.

Below the porous chuck 300, a chuck driving unit 303 is provided. The porous chuck 300 can rotate by means of the chuck driving unit 303. Further, the chuck driving unit 303 is attached to the top of a rail 304 provided at the bottom surface inside the processing container 290 and extending along the Y-direction. By means of the chuck driving unit 303, the porous chuck 300 can move along the rail 304. More specifically, the porous chuck 300 can move between a delivery position P1 for transferring in/out the processing target wafer W to/from the outside of the processing container 290 and an alignment position P2 where the position of a notch portion of the processing target wafer W is adjusted.

At the alignment position P2, a sensor 305 is provided which detects the position of the notch portion of the processing target wafer W held on the porous chuck 300. The chuck driving unit 303 rotates the porous chuck 300 while the sensor 305 is detecting the position of the notch portion, and thereby can adjust the position of the notch portion of the processing target wafer W.

On a side surface on the alignment position P2 side in the processing container 290, an imaging apparatus 310 is provided. As the imaging apparatus 310, for example, a wide-angle CCD camera is used. Near the middle of the upper portion of the processing container 290, a half mirror 311 is provided. The half mirror 311 is provided at a position facing the imaging apparatus 310, and inclined at 45 degrees from the vertical direction. An illumination apparatus 312 that can change in illuminance is provided above the half mirror 311, and the half mirror 311 and the illumination apparatus 312 are fixed to the upper surface of the processing container 290. Further, the imaging apparatus 310, the half mirror 311, and the illumination apparatus 312 are provided above the processing target wafer W held on the porous chuck 300. The illumination from the illumination apparatus 312 passes through the half mirror 311 and is applied downward. Accordingly, reflection light from an object existing in an irradiation area thereof is reflected off the half mirror 311 and is taken into the imaging apparatus 310. In other words, the imaging apparatus 310 can capture an image of the object existing in the illumination area. The captured image of the processing target wafer W is then outputted to a later-described control unit 350. The control unit 350 inspects the presence or absence of a residue of the adhesive G on the processing target wafer W and the presence or absence of a residue of an oxide film formed on the bumps on the joint surface $W_J$ of the processing target wafer W.

In the above separation system 1, the control unit 350 is provided as illustrated in FIG. 1. The control unit 350 is, for example, a computer and has a program storage unit (not illustrated). In the program storage unit, a program is stored which controls the processing of the processing target wafer W, the supporting wafer S, and the superposed wafer T in the separation system 1. Further, the program storage unit also stores a program for controlling the operation of the driving system such as the above-described various processing and treatment apparatuses and transfer apparatuses to implement the later-described separation processing in the separation system 1. Note that the program may be the one that is stored, for example, in a computer-readable storage medium H such as a computer-readable hard disk (HD), flexible disk (FD), compact disk (CD), magneto-optical disk (MO), or memory card, and installed from the storage medium H into the control unit 350.

Figure 11:
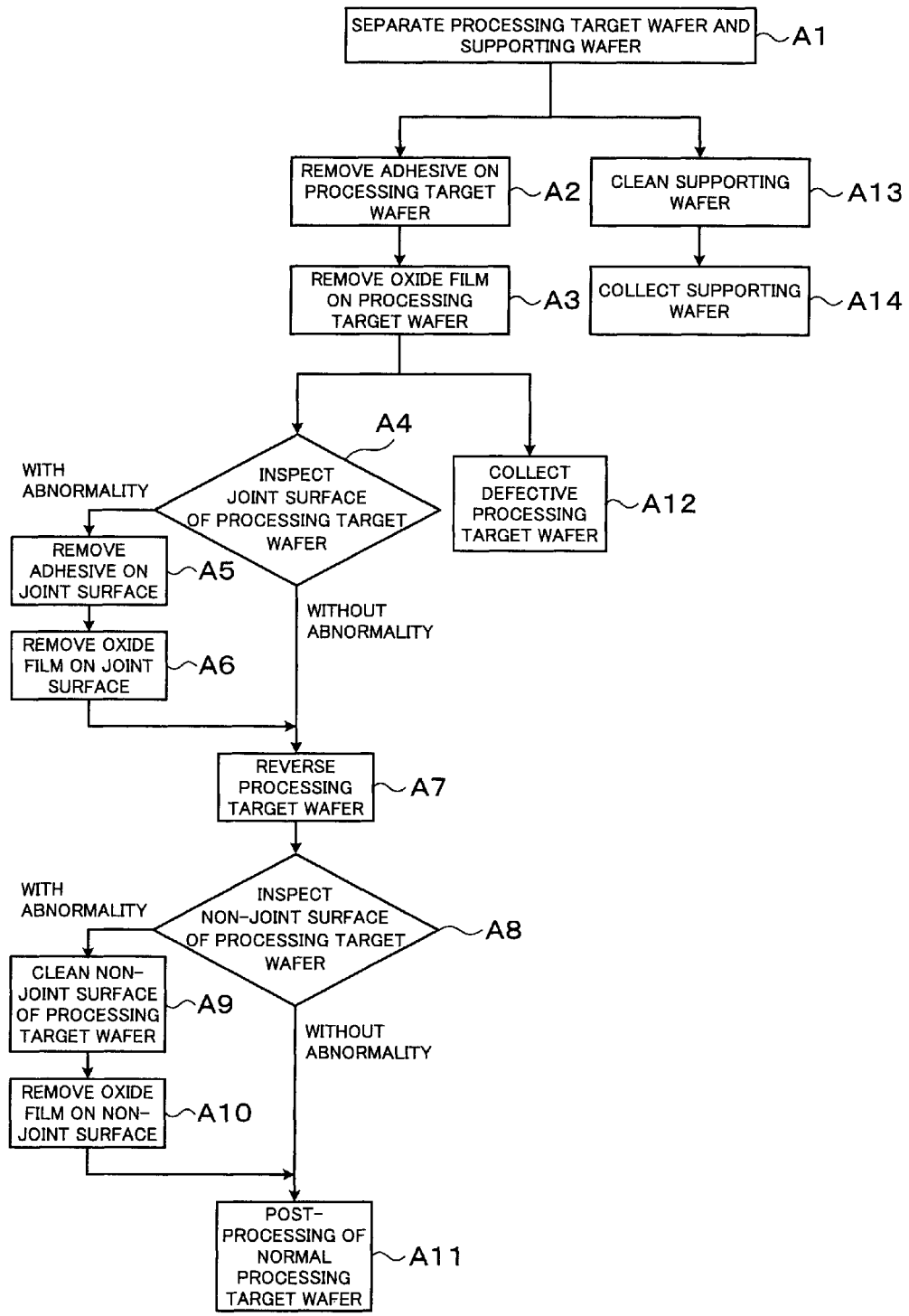
FIG. 11 A flowchart illustrating main steps of separation processing.

Next, the separation processing method of the processing target wafer W and the supporting wafer S performed using the separation system 1 configured as described above will be described. FIG. 11 is a flowchart illustrating an example of main steps of the separation processing.

First, a cassette $C_T$ housing a plurality of superposed wafers T, an empty cassette $C_W$, and an empty cassette $C_S$ are mounted on the predetermined cassette mounting plates 11 in the transfer-in/out station 2. The superposed wafer T in the cassette $C_T$ is taken out by the first transfer apparatus 20 and transferred to the separation apparatus 30 in the separation processing station 3. In this event, the superposed wafer T is transferred with the processing target wafer W arranged on the upper side and the supporting wafer S arranged on the lower side.

Figure 12:
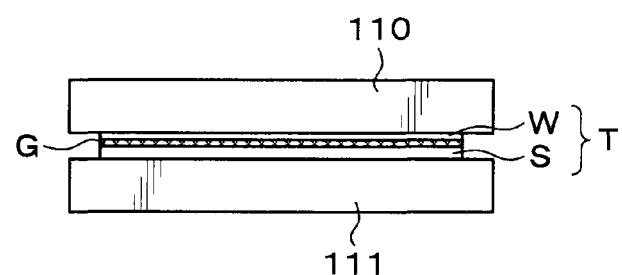
FIG. 12 An explanatory view illustrating the appearance in which a superposed wafer is held by a first holding unit and a second holding unit in the separation apparatus.

The superposed wafer T transferred in the separation apparatus 30 is suction-held on the second holding unit 111. Thereafter, the second holding unit 111 is raised by the moving mechanism 150 so that the superposed wafer T is held sandwiched by the first holding unit 110 and the second holding unit 111 as illustrated in FIG. 12. In this event, the non-joint surface $W_N$ of the processing target wafer W is suction-held by the first holding unit 110, and the non-joint surface $S_N$ of the supporting wafer S is suction-held by the second holding unit 111.

Thereafter, the heating mechanisms 124, 141 heat the superposed wafer T to a predetermine temperature, for example, 200° C. Then, the adhesive G in the superposed wafer T becomes softened.

Figure 13:
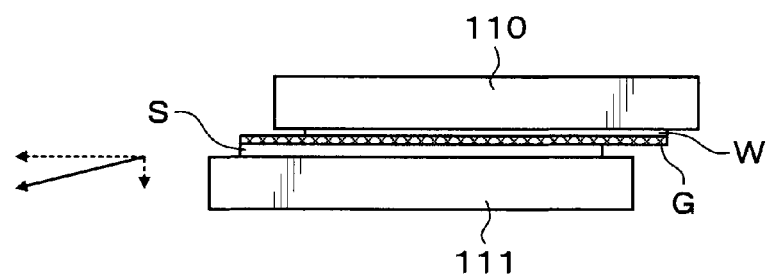
FIG. 13 An explanatory view illustrating the appearance in which the second holding unit in the separation apparatus is moved in the vertical direction and the horizontal direction.
Figure 14:
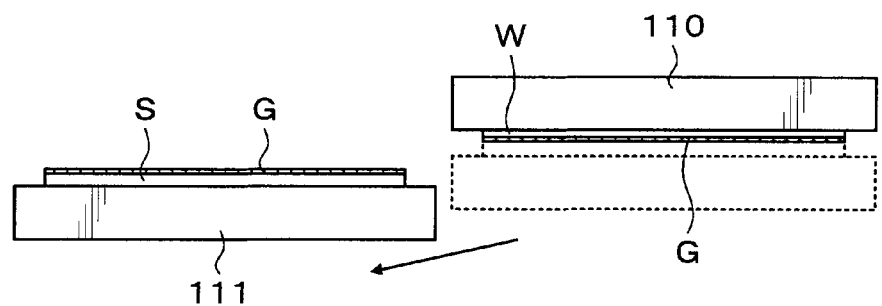
FIG. 14 An explanatory view illustrating the appearance in which the processing target wafer and the supporting wafer are separated in the separation apparatus.

Subsequently, while the heating mechanisms 124, 141 are heating the superposed wafer T to keep the softened state of the adhesive G, the second holding unit 111 and the supporting wafer S are moved by the moving mechanism 150 in the vertical direction and the horizontal direction, namely, obliquely downward as illustrated in FIG. 13. Then, as illustrated in FIG. 14, the processing target wafer W held by the first holding unit 110 and the supporting wafer S held by the second holding unit 111 are separated as illustrated in FIG. 14 (step A1 in FIG. 11).

In this event, the second holding unit 111 moves 100 μm in the vertical direction and moves 300 mm in the horizontal direction. Incidentally, in this embodiment, the thickness of the adhesive G in the superposed wafer T is, for example, 30 μm to 40 μm and the height of the bumps formed on the joint surface $W_J$ of the processing target wafer W is, for example, 20 μm. Accordingly, the distance between the devices (predetermined patterns) on the processing target wafer W and the supporting wafer S is minute. Hence, for example, when the second holding unit 111 is moved only in the horizontal direction, the devices and the supporting wafer S can come into contact with each other, whereby the devices may be damaged. In this regard, moving the second holding unit 111 in the horizontal direction and also in the vertical direction as in this embodiment can prevent the contact between the devices and the supporting wafer S to suppress damage to the devices. Note that the ratio between the moving distance in the vertical direction and the moving distance in the horizontal direction of the second holding unit 111 is set based on the height of the bumps on the processing target wafer W.

Note that when separating the superposed wafer T into the processing target wafer W and the supporting wafer S as described above, the atmosphere inside the processing container 100 has been exhausted, but a minimal amount of oxygen remains. Even if the remaining oxygen is minimal, an oxide film is formed on the predetermined patterns on the joint surface $W_J$ of the processing target wafer W, in particular, on the bumps because the processing target wafer W is heated.

Thereafter, the processing target wafer W separated in the separation apparatus 30 is transferred by the second transfer apparatus 32 to the first cleaning apparatus 31. Here, the transfer method of the processing target wafer W by the second transfer apparatus 32 will be described.

Figure 15:
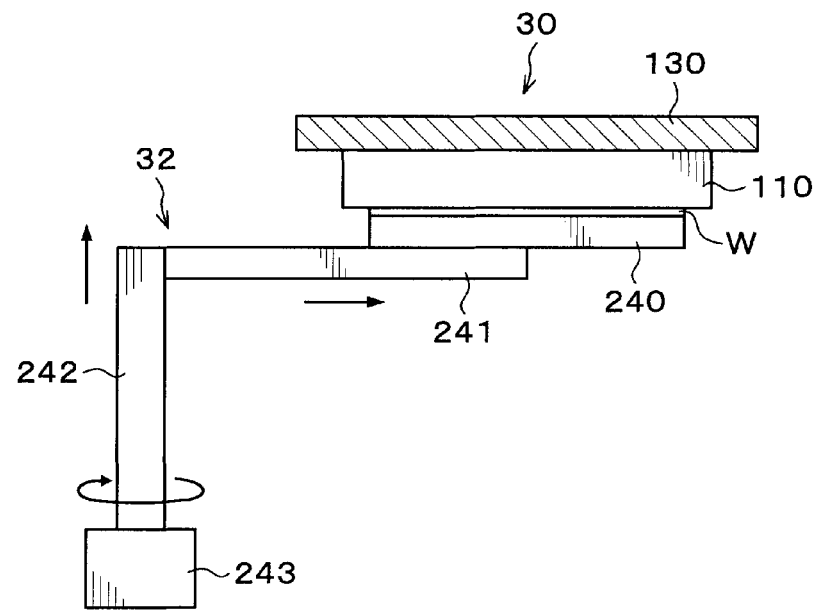
FIG. 15 An explanatory view illustrating the appearance in which the processing target wafer is delivered from the first holding unit of the separation apparatus to a Bernoulli chuck of the second transfer apparatus.

The supporting arm 241 of the second transfer apparatus 32 is extended to locate the Bernoulli chuck 240 below the processing target wafer W held by the first holding unit 110 as illustrated in FIG. 15. Thereafter, the Bernoulli chuck 240 is raised, and the suction of the processing target wafer W from the suction pipe 123 at the first holding unit 110 is stopped. Then, the processing target wafer W is delivered from the first holding unit 110 to the Bernoulli chuck 240. Thereafter, the Bernoulli chuck 240 is lowered to a predetermined position. Note that the processing target wafer W is held by the Bernoulli chuck 240 in a manner not in contact therewith. Therefore, the processing target wafer W is held with the devices on the joint surface $W_J$ of the processing target wafer W being never damaged. Note that the second holding unit 111 is moved to a position facing the first holding unit 110 in this event.

Figure 16:
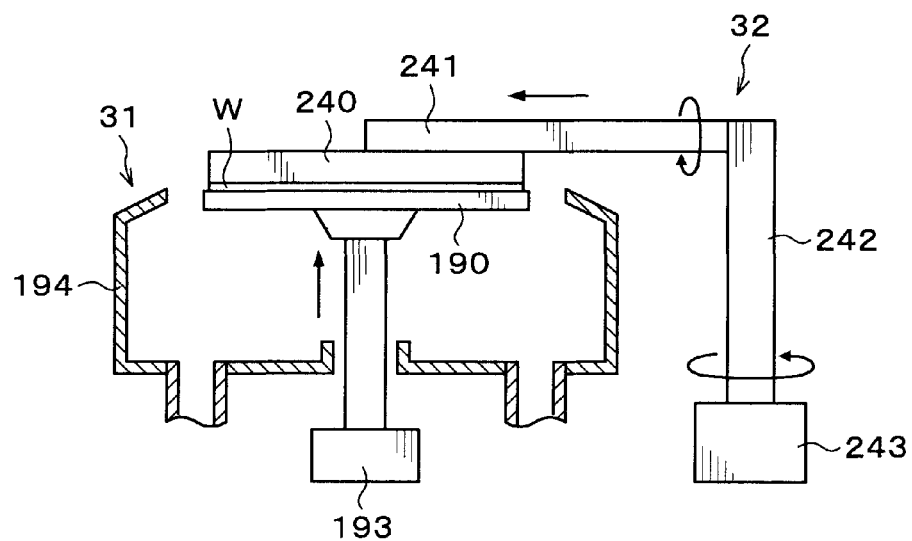
FIG. 16 An explanatory view illustrating the appearance in which the processing target wafer is delivered from the Bernoulli chuck of the second transfer apparatus to a porous chuck of the first cleaning apparatus.

Next, as illustrated in FIG. 16, the supporting arm 241 of the second transfer apparatus 32 is turned to move the Bernoulli chuck 240 to above the porous chuck 190 in the first cleaning apparatus 31 and reverse the Bernoulli chuck 240 to thereby direct the processing target wafer W downward. In this event, the porous chuck 190 is raised to a position upper than the cup 194 and kept waiting. Thereafter, the processing target wafer W is delivered from the Bernoulli chuck 240 to the porous chuck 190 and suction-held.

After the processing target wafer W is suction-held on the porous chuck 190 in this manner, the porous chuck 190 is lowered to a predetermined position. Subsequently, the first arm 201 moves the solvent nozzle 203 at the waiting section 205 to a position above the central portion of the processing target wafer W. Thereafter, while the porous chuck 190 is rotating the processing target wafer W, the organic solvent is supplied from the solvent nozzle 203 to the joint surface $W_J$ of the processing target wafer W. The supplied organic solvent is diffused over the entire joint surface $W_J$ of the processing target wafer W by the centrifugal force, whereby the adhesive G on the joint surface $W_J$ of the processing target wafer W is removed (step A2 in FIG. 11).

After the adhesive G on the joint surface $W_J$ of the processing target wafer W is removed, the solvent nozzle 203 is moved from above the central portion of the processing target wafer W to the waiting section 205, and the acetic acid nozzle 220 at the waiting section 205 is moved by the second arm 202 to a position above the central portion of the processing target wafer W. Thereafter, while the processing target wafer W is being rotated, the acetic acid is supplied from the acetic acid nozzle 220 to the joint surface $W_J$ of the processing target wafer W. The supplied acetic acid is diffused by the centrifugal force over the entire joint surface $W_J$ of the processing target wafer W to remove the oxide film formed on the bumps on the joint surface $W_J$ of the processing target wafer W (step A3 in FIG. 11).

In step A3, the acetic acid with a concentration of 70% is supplied to the joint surface $W_J$ of the processing target wafer W. As a result of earnest study of the inventors, it is found that even if the acetic acid with a concentration of 70% is used as described above, the oxide film on the bumps can be sufficiently removed by adjusting the supply flow rate and the supply period of the acetic acid, the rotation period of the processing target wafer W and the like. For example, it is found that by supplying the acetic acid at 0.31 lit/min for 180 to 240 seconds and rotating the processing target wafer W for 60 seconds, the oxide film on the bumps can be removed. Further, the acetic acid with a low concentration is used as described above, so that even if the acetic acid is supplied onto patterns except the bumps, such as patterns having no oxide formed thereon, damage to the patterns can be avoided. Note that the concentration of the acetic acid is not limited to 70% but may be a predetermined concentration or more with which the acetic acid can remove the oxide film on the bumps.

Here, the plurality of superposed wafers T transferred in the transfer-in/out station 2 have been subjected to inspection in advance as described above and discriminated between a superposed wafer T including a normal processing target wafer W and a superposed wafer T including a defective processing target wafer W.

The normal processing target wafer W separated from the normal superposed wafer T is cleaned at its joint surface $W_J$ in steps A2 and A3 and then transferred with the non-joint surface $W_N$ directed downward, by the third transfer apparatus 51 to the inspection apparatus 7. Note that the transfer of the processing target wafer W by the third transfer apparatus 51 is substantially the same as the above-described transfer of the processing target wafer W by the second transfer apparatus 32, and therefore the description thereof is omitted.

The processing target wafer W transferred to the inspection apparatus 7 is held on the porous chuck 300 at the delivery position P1. Subsequently, the chuck driving unit 303 moves the porous chuck 300 to the alignment position P2. Then, while the sensor 305 is detecting the position of the notch portion of the processing target wafer W, the chuck driving unit 303 rotates the porous chuck 300. Then, the position of the notch portion of the processing target wafer W is adjusted, whereby the processing target wafer W is located in a predetermined orientation.

Thereafter, the chuck driving unit 303 moves the porous 300 from the alignment position P2 to the delivery position P1. Then, illumination is applied from the illumination apparatus 312 to the processing target wafer W when the processing target wafer W passes under the half mirror 311. The light by the illumination reflected off the top of the processing target wafer W is taken into the imaging apparatus 310, so that an image of the joint surface $W_J$ of the processing target wafer W is captured in the imaging apparatus 310. The captured image of the joint surface $W_J$ of the processing target wafer W is outputted to the control unit 350, and the control unit 350 inspects the presence or absence of a residue of the adhesive G on the joint surface $W_J$ of the processing target wafer W and the presence or absence of a residue of the oxide film formed on the bumps on the joint surface $W_J$ of the processing target wafer W (step A4 in FIG. 11).

If a residue of the adhesive G and a residue of the oxide film are verified in the inspection apparatus 7, the processing target wafer W is transferred by the third transfer apparatus 51 to the joint surface cleaning apparatus 40 in the post-inspection cleaning station 8, and the adhesive G on the joint surface $W_J$ is removed in the joint surface cleaning apparatus 40 (step A5 in FIG. 11). Further, the oxide film on the bumps on the joint surface $W_J$ is also removed in the joint surface cleaning apparatus 40 (step A6 in FIG. 11). Note that steps A5 and A6 are the same as those of the above-described steps A2 and A3 respectively, and the description thereof is omitted. Further, for example, if it is verified that there is no residue of the adhesive G in the inspection apparatus 7, step A5 may be omitted. Similarly, if it is verified that there is no residue of the oxide film in the inspection apparatus 7, step A6 may be omitted.

After the joint surface $W_J$ is cleaned, the processing target wafer W is transferred by the third transfer apparatus 51 to the reversing apparatus 42, and its front and rear surfaces are reversed, namely, reversed in the top-bottom direction by the reversing apparatus 42 (step A7 in FIG. 11). The reversing method of the processing target wafer W by the reversing apparatus 42 will be described here.

Figure 17:
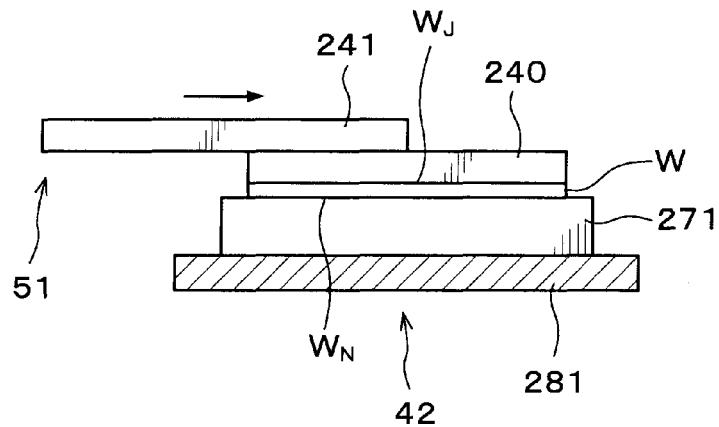
FIG. 17 An explanatory view illustrating the appearance in which the processing target wafer is delivered from a Bernoulli chuck of a third transfer unit to a second holding unit of the reversing apparatus.

The processing target wafer W having the joint surface $W_J$ cleaned in the joint surface cleaning apparatus 40 is transferred to the reversing apparatus 42 with the joint surface $W_J$ being held by the Bernoulli chuck 240 of the third transfer apparatus 51 as illustrated in FIG. 17. Then, the processing target wafer W is delivered to the second holding unit 271 of the reversing apparatus 42 with the joint surface $W_J$ directed upward, and the entire non-joint surface $W_N$ of the processing target wafer W is held by the second holding unit 271.

Figure 18:
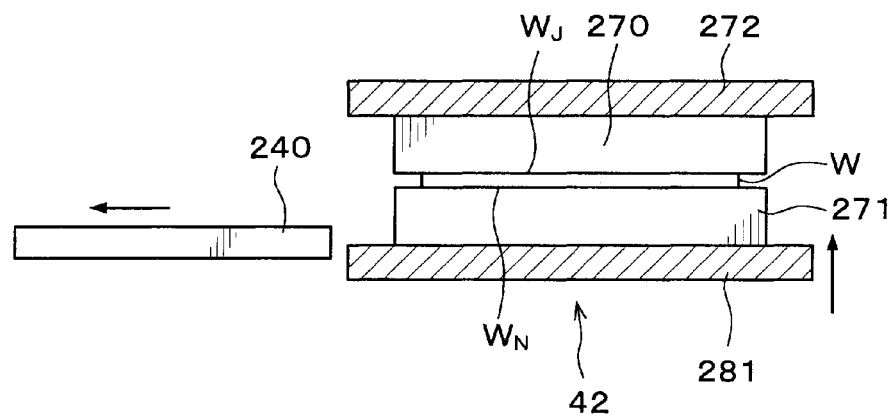
FIG. 18 An explanatory view illustrating the appearance in which the processing target wafer is delivered from the second holding unit of the reversing apparatus to a first holding unit.
Figure 19:
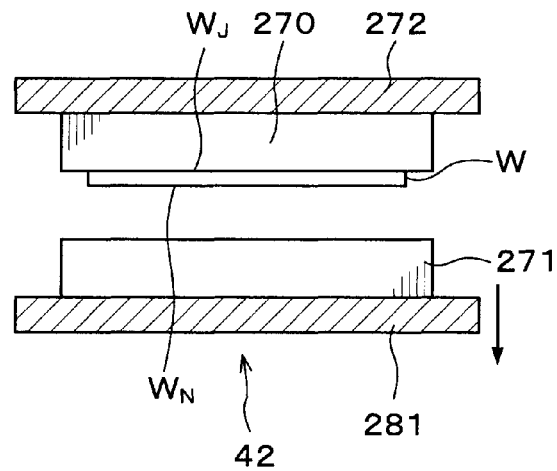
FIG. 19 An explanatory view illustrating the state in which the processing target wafer has been delivered from the second holding unit of the reversing apparatus to the first holding unit.

Then, the Bernoulli chuck 240 of the third transfer apparatus 51 is retracted from above the second holding unit 271, and the second holding unit 271 is raised, in other words, made to approach to the first holding unit 270 by the supporting body 283 as illustrated in FIG. 18. Then, the joint surface $W_J$ of the processing target wafer W is held by the first holding unit 270 and the holding of the processing target wafer W by the second holding unit 271 is stopped to deliver the processing target wafer W to the first holding unit 270. Thus, the processing target wafer W is held by the first holding unit 270 with the non-joint surface $W_N$ directed downward as illustrated in FIG. 19.

Figure 20:
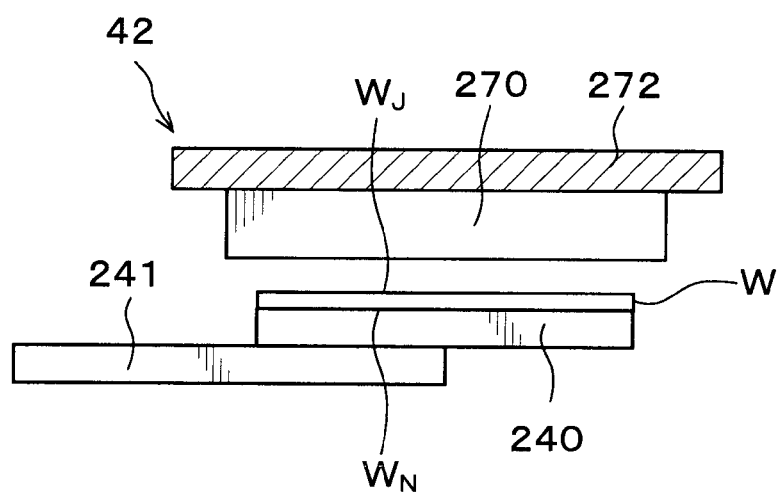
FIG. 20 An explanatory view illustrating the state in which the processing target wafer has been delivered from the first holding unit of the reversing apparatus to the Bernoulli chuck of the third transfer unit.

Thereafter, the second holding unit 271 is lowered to separate the first holding unit 270 and the second holding unit 271, and the retracted Bernoulli chuck 240 of the third transfer apparatus 51 is then turned around the horizontal axis. Then, with the Bernoulli chuck 240 directed upward, the Bernoulli chuck 240 is located below the first holding unit 270. Then, the Bernoulli chuck 240 is raised, and the holding of the processing target wafer W by the first holding unit 270 is stopped concurrently therewith. Thereby the processing target wafer W having the joint surface $W_J$ held by the Bernoulli chuck 240 when transferred into the joint surface cleaning apparatus 40 is brought into a state in which the non-joint surface $W_N$ is held by the Bernoulli chuck 240 as illustrated in FIG. 20. In other words, the processing target wafer W is brought into a state in which the surface of the processing target wafer held by the Bernoulli chuck 240 is changed from front to rear. Thereafter, the Bernoulli chuck 240 holding the non-joint surface $W_N$ of the processing target wafer W is retracted from the reversing apparatus 42.

Note that if a residue of the adhesive G and a residue of the oxide film are not verified in the inspection apparatus 7, the processing target wafer W is subjected to the reversal in the reversing apparatus 42 without being transferred to the joint surface cleaning apparatus 40. The reversing method is the same as the above-described method.

Thereafter, the Bernoulli chuck 240 of the third transfer apparatus 51 holding the processing target wafer W is turned around the horizontal axis to reverse the processing target wafer W in the top-bottom direction. Then, the processing target wafer W with the non-joint surface $W_N$ directed upward is transferred by the Bernoulli chuck 240 again to the inspection apparatus 7, and the non-joint surface $W_N$ is inspected (step A8 in FIG. 11). Then, when the contamination such as particles or an oxide film is verified on the non-joint surface $W_N$, the processing target wafer W is transferred by the third transfer apparatus 51 to the non-joint surface cleaning apparatus 41, and the non-joint surface $W_N$ is cleaned by the non-joint surface cleaning apparatus 41 (step A9 in FIG. 11). Further, the oxide film on the non-joint surface $W_N$ is also removed in the non-joint surface cleaning apparatus 41 (step A10 in FIG. 11). Note that since the predetermined patterns are not formed on the non-joint surface $W_N$ of the processing target wafer W, the oxide film is not formed on the bumps of the predetermined patterns in this embodiment. However, if the oxide film is formed on the non-joint surface $W_N$ itself, step A10 is performed. Further, steps A9 and A10 are the same as the above-described step A2 and step A3, and therefore the description thereof is omitted. Further, for example, if it is verified that there is no contamination such as particles and an oxide film in the inspection apparatus 7, steps A9 and A10 may be omitted.

Then, the cleaned processing target wafer W is transferred by the third transfer apparatus 51 to the post-processing station 4. Note that if a residue of the adhesive G and a residue of the oxide film are not verified in the inspection apparatus 7, the processing target wafer W is transferred to the post-processing station 4 as it is without being transferred to the non-joint surface cleaning apparatus 41.

Thereafter, predetermined post-processing is performed on the processing target wafer W in the post-processing station 4 (step A11 in FIG. 11). In this manner, the processing target wafer W becomes a product.

On the other hand, the defective processing target wafer W separated from the defective superposed wafer T is cleaned at its joint surface $W_J$ in steps A2 and A3 and then transferred by the first transfer apparatus 20 to the transfer-in/out station 2. Thereafter, the defective processing target wafer W is transferred from the transfer-in/out station 2 to the outside and collected (step A12 in FIG. 11).

While the above-described steps A1 to A12 are being performed on the processing target wafer W, the supporting wafer S separated in the separation apparatus 30 is transferred by the first transfer apparatus 20 to the second cleaning apparatus 33. Then, in the second cleaning apparatus 33, the adhesive on the joint surface $S_J$ of the supporting wafer S is removed, whereby the joint surface $S_J$ is cleaned (step A13 in FIG. 11). Note that the cleaning of the supporting wafer S in step A13 is the same as the removal of the adhesive G on the processing target wafer W in the above-described step A2, and therefore the description thereof is omitted.

Thereafter, the supporting wafer S whose joint surface $S_J$ has been cleaned is transferred by the first transfer apparatus 20 to the transfer-in/out station 2. Then, the supporting wafer S is transferred from the transfer-in/out station 2 to the outside and collected (step A14 in FIG. 11). Thus, a series of separation processing of the processing target wafer W and the supporting wafer S ends.

According to this embodiment, after the superposed wafer T is separated into the processing target wafer W and the supporting wafer S in step A1, the adhesive G on the joint surface $W_J$ of the processing target wafer W is removed in subsequent step A2, the acetic acid is supplied to the joint surface $W_J$ of the processing target wafer W in step A3. Therefore, even if an oxide film is formed on the bumps on the joint surface $W_J$ of the processing target wafer W in step A1, the oxide film can be removed with the acetic acid supplied in step A3. This enables appropriate manufacture of products.

Further, when the inspection of the joint surface $W_J$ separated in step A4 is performed and it is verified that the oxide film remains on the bumps on the joint surface $W_J$ of the processing target wafer W, the acetic acid is supplied to the joint surface $W_J$ of the processing target wafer W in subsequent step A6 to remove the oxide film. Therefore, the oxide film on the bumps on the joint surface $W_J$ of the processing target wafer W can be more surely removed.

Further, since the acetic acid with a concentration of 70% is used in removing the oxide film in steps A3, A6, A10, the oxide film can be sufficiently removed. In addition, the acetic acid with such a low concentration is used as described above, so that even if the acetic acid is supplied onto the patterns having no oxide formed thereon, damage to the patterns can be avoided.

Further, since the acetic acid is used in removing the oxide film in steps A3, A6, A10, high safety can be secured. Further, since the acetic acid is inexpensive, the manufacturing cost of products can be reduced.

In the above embodiment, after removal of the oxide film on the bumps on the joint surface $W_J$ of the processing target wafer W in step A3, a rust inhibitor may be further applied to the joint surface $W_J$ of the processing target wafer W.

Figure 21:
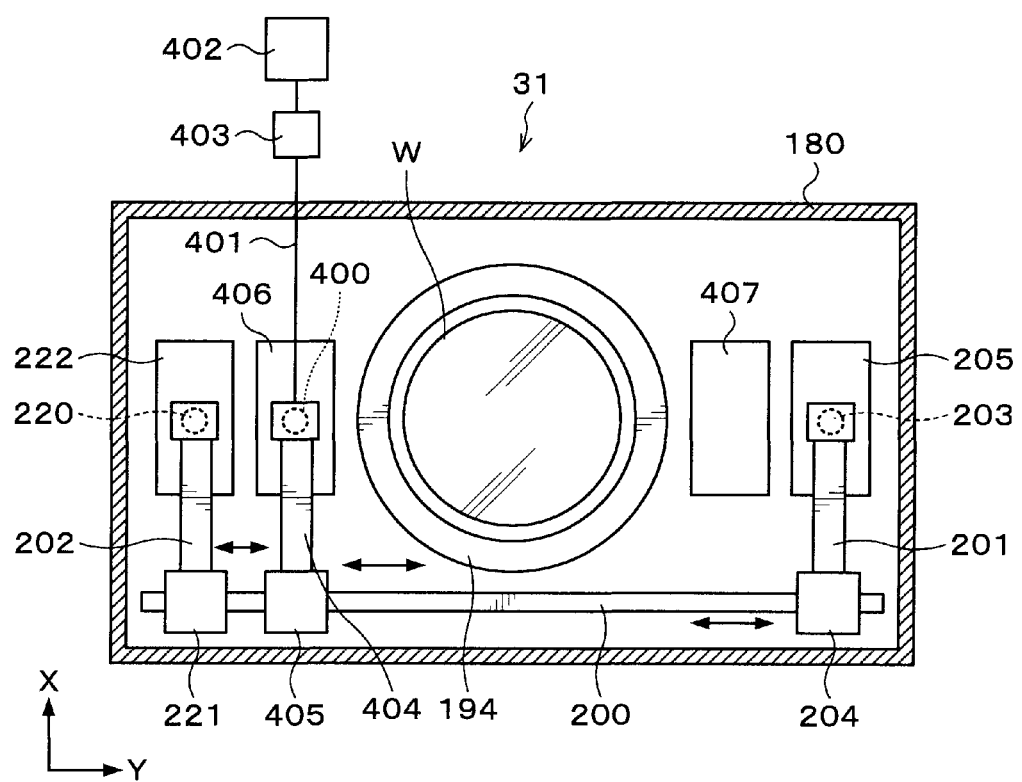
FIG. 21 A transverse sectional view illustrating the outline of a configuration of a first cleaning apparatus according to another embodiment.

As illustrated in FIG. 21, a rust inhibitor nozzle 400 as a rust inhibitor supplying unit that applies the rust inhibitor to the joint surface $W_J$ of the processing target wafer W held by the porous chuck 190 is provided in the first cleaning apparatus 31. To the rust inhibitor nozzle 400, a supply pipe 401 is connected. The supply pipe 401 communicates with a rust inhibitor supply source 402 that stores the rust inhibitor therein. Further, along the supply pipe 401, a supply equipment group 403 is provided which includes a valve, a flow regulator and so on that control the flow of the rust inhibitor. Note that, for example, an acidic water-soluble polymer is used as the rust inhibitor.

The rust inhibitor nozzle 400 is supported by a third arm 404. The third arm 404 is movable on the rail 200 by means of a nozzle driving unit 405. Thus, the rust inhibitor nozzle 400 can more between a waiting section 406 which is provided between the cup 194 and the waiting section 222, and a waiting section 407 which is provided between the cup 194 and the waiting section 205, and further move in the diameter direction of the processing target wafer W above the processing target wafer W in the cup 194. Further, the third arm 404 can freely rise and lower by means of the nozzle driving unit 405 to be able to adjust the height of the rust inhibitor nozzle 400. Note that the other configuration of the first cleaning apparatus 31 is the same as the configuration of the first cleaning apparatus 31 in the above embodiment, and therefore the description thereof will be omitted.

In this case, after the acetic acid is supplied from the acetic acid nozzle 220 to the joint surface $W_J$ of the processing target wafer W to remove the oxide film on the bumps on the joint surface $W_J$ of the processing target wafer W in step A3, the rust inhibitor nozzle 400 at the waiting section 406 is moved by the third arm 404 to a position above the central portion of the processing target wafer W. Thereafter, the rust inhibitor is supplied from the rust inhibitor nozzle 400 to the joint surface $W_J$ of the processing target wafer W while the processing target wafer W is being rotated. The supplied rust inhibitor is diffused over the entire joint surface $W_J$ of the processing target wafer W by the centrifugal force. Note that the other steps A1, A2, A4 to A14 are the same as steps A1, A2, A4 to A14 in the above embodiment, and therefore the description thereof will be omitted.

According to this embodiment, the rust inhibitor is applied to the joint surface $W_J$ of the processing target wafer W to protect the joint surface $W_J$ from rust after the oxide film on the bumps is removed, so that it is possible to surely prevent an oxide film from being formed on the humps even when transfer in the atmosphere and predetermined treatments are then performed on the processing target wafer W.

Note that the joint surface cleaning apparatus 40 and the non-joint surface cleaning apparatus 41 may have the same configuration as that of the above-described first cleaning apparatus 31 and supply the rust inhibitor to the joint surface $W_J$ of the processing target wafer W after steps A6 and A10.

In the first cleaning apparatus 31 in the above embodiment, a waste solution of the acetic acid may be neutralized by an alkali solution. For the alkali solution, a weak alkali solution is used and, for example, a solution of caustic soda (sodium hydroxide) is used.

Figure 22:
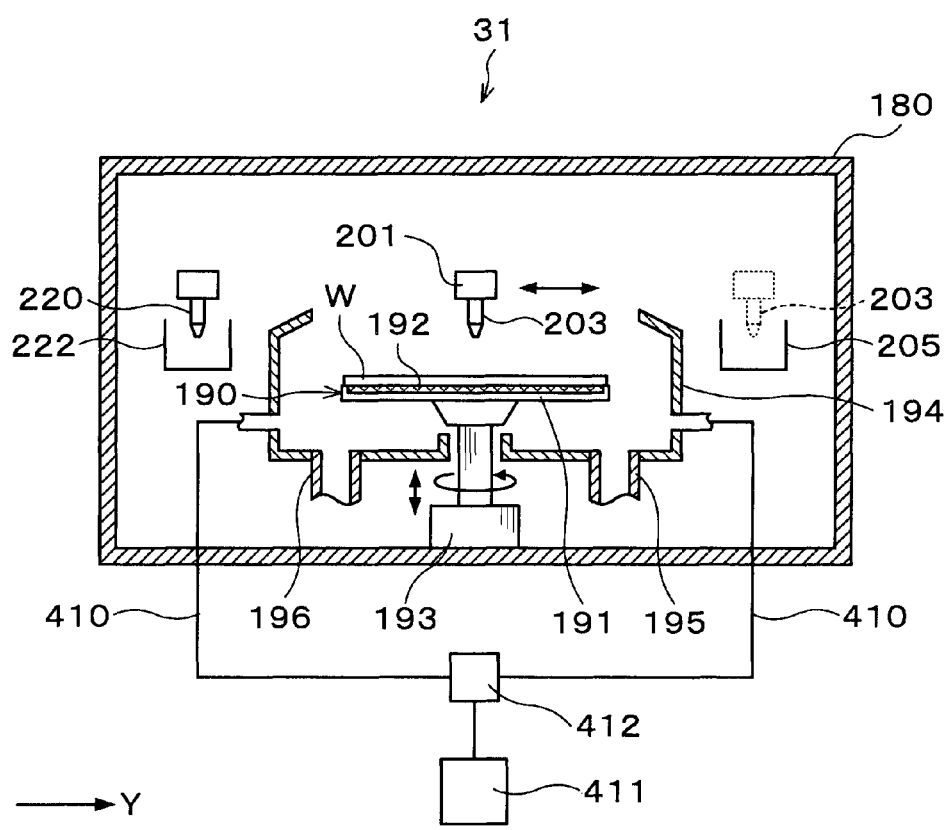
FIG. 22 A longitudinal sectional view illustrating the outline of a configuration of a first cleaning apparatus according to another embodiment.

As illustrated in FIG. 22, on the side surface of the cup 194 of the first cleaning apparatus 31, an alkali supply pipe 410 is provided as an alkali supplying unit that supplies the alkali solution to the inside of the cup 194. A plurality of alkali supply pipes 410 may be provided. Further, the alkali supply pipe 410 communicates with an alkali supply source 411 that stores the alkali solution therein. Further, along the alkali supply pipe 410, a supply equipment group 412 is provided which includes a valve, a flow regulator and so on that control the flow of the alkali solution. Note that the other configuration of the first cleaning apparatus 31 is the same as the configuration of the first cleaning apparatus 31 in the above embodiment, and therefore the description thereof will be omitted.

In this case, the acetic acid supplied onto the processing target wafer W in step A3 splashes from the processing target wafer W and is recovered by the cup 194. Further, the alkali solution is supplied from the alkali supply pipe 410 to the inside of the cup 194. Then, the waste solution of the acetic acid inside the cup 194 is neutralized by the alkali solution and discharged from the acetic acid drain pipe 196. Note that the other steps A1, A2, A4 to A14 are the same as steps A1, A2, A4 to A14 in the above embodiment, and therefore the description thereof will be omitted.

The above-described alkali supply pipe 410 may be provided in the acetic acid drain pipe 196 or may be provided in a waste solution tank (not illustrated) to which the acetic acid drain pipe 196 is connected and in which the waste solution of the acetic acid is stored.

Figure 23:
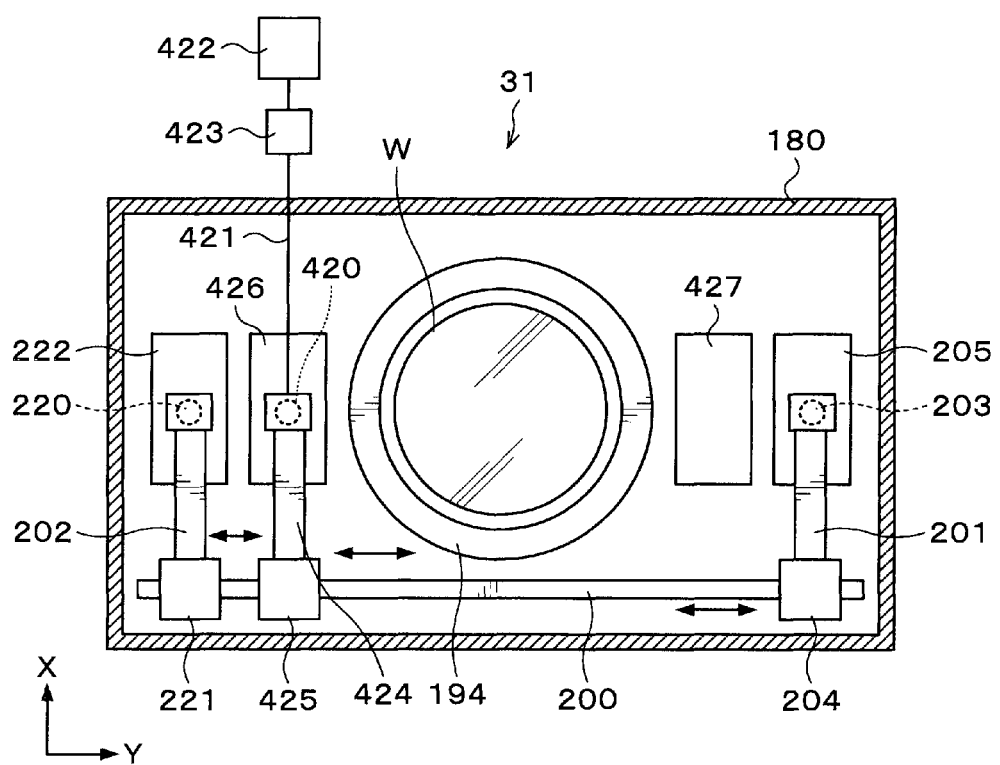
FIG. 23 A transverse sectional view illustrating the outline of a configuration of a first cleaning apparatus according to another embodiment.

Further, as illustrated in FIG. 23, an alkali nozzle 420 may be provided as an alkali supplying unit that supplies the alkali solution onto the processing target wafer W held by the porous chuck 190 in the first cleaning apparatus 31. To the alkali nozzle 420, a supply pipe 421 is connected. The supply pipe 421 communicates with an alkali supply source 422 that stores the alkali solution therein. Further, along the alkali supply pipe 421, a supply equipment group 423 is provided which includes a valve, a flow regulator and so on that control the flow of the alkali solution.

The alkali nozzle 420 is supported by a fourth arm 424. The fourth arm 424 is movable on the rail 200 by means of a nozzle driving unit 425. Thus, the alkali nozzle 420 can move between a waiting section 426 which is provided between the cup 194 and the waiting section 222, and a waiting section 427 which is provided between the cup 194 and the waiting section 205, and further move in the diameter direction of the processing target wafer W above the processing target wafer W in the cup 194. Further, the fourth arm 424 can freely rise and lower by means of the nozzle driving unit 425 to be able to adjust the height of the alkali nozzle 420. Note that the other configuration of the first cleaning apparatus 31 is the same as the configuration of the first cleaning apparatus 31 in the above embodiment, and therefore the description thereof will be omitted.

In this case, after the acetic acid is supplied from the acetic acid nozzle 220 to the joint surface $W_J$ of the processing target wafer W to remove the oxide film on the bumps on the joint surface $W_J$ of the processing target wafer W in step A3, the alkali nozzle 420 at the waiting section 426 is moved by the fourth arm 424 to a position above the central portion of the processing target wafer W. Thereafter, the alkali solution is supplied from the alkali nozzle 420 to the joint surface $W_J$ of the processing target wafer W while the processing target wafer W is being rotated. The supplied alkali solution is diffused over the entire joint surface $W_J$ of the processing target wafer W by the centrifugal force and scatters in the cup 194. Then, the alkali solution neutralizes the acetic acid remaining on the processing target wafer W or the waste solution of the acetic acid recovered inside the cup 194. The neutralized waste solution of the acetic acid is drained from the acetic acid drain pipe 196. Note that the other steps A1, A2, A4 to A14 are the same as steps A1, A2, A4 to A14 in the above embodiment, and therefore the description thereof will be omitted.

In any of the embodiments, the waste solution of the acetic acid is neutralized by the alkali solution, thereby making it easy to handle the waste solution of the acetic acid when it is disposed of. It is also possible to secure high safety.

Note that the joint surface cleaning apparatus 40 and the non-joint surface cleaning apparatus 41 may have the same configuration as that of the above-described first cleaning apparatus 31 and neutralize the waste solution of the acetic acid in steps A6 and A10.

Though the acetic acid in the liquid state is supplied from the acetic acid nozzle 220 to the joint surface $W_J$ of the processing target wafer W in the first cleaning apparatus 31 in the above embodiment, acetic acid in a gaseous state may be supplied to the joint surface $W_J$ of the processing target wafer W.

Figure 24:
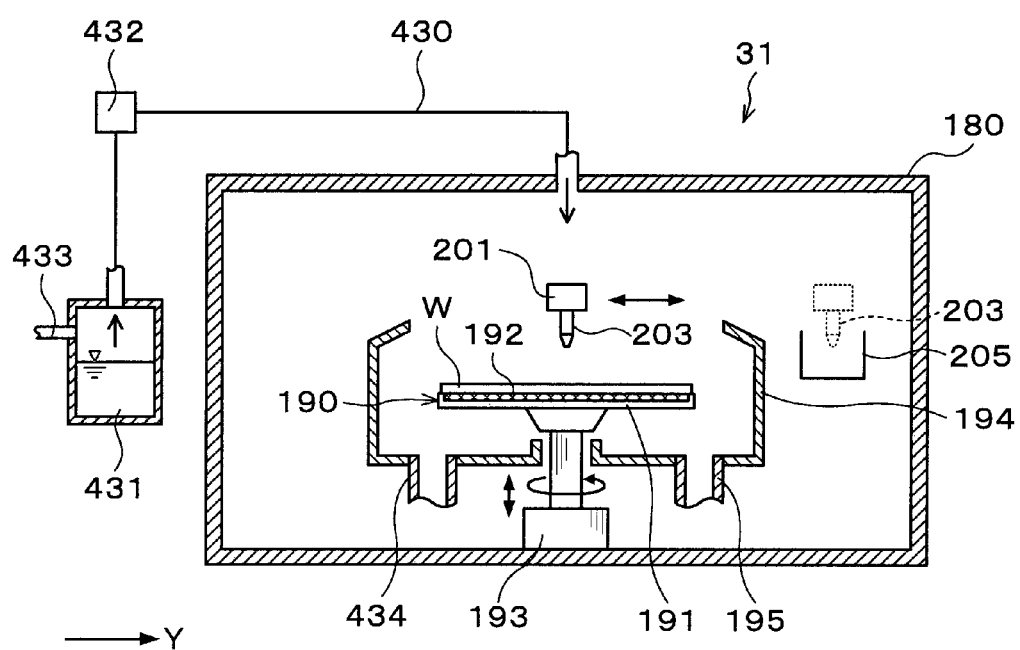
FIG. 24 A longitudinal sectional view illustrating the outline of a configuration of a first cleaning apparatus according to another embodiment.

As illustrated in FIG. 24, an acetic acid gas supply pipe 430 as an acid supplying unit that supplies the acetic acid gas in the gaseous state to the joint surface $W_J$ of the processing target wafer W is provided on the ceiling surface of the treatment container 180 and above the processing target wafer W held on the spin chuck 190 in the first cleaning apparatus 31. To the acetic acid gas supply pipe 430, an acetic acid supply source 431 that supplies the acetic acid gas is connected. Further, along the acetic acid gas supply pipe 430, a supply equipment group 432 is provided which includes a valve, a flow regulator and so on that control the flow of the acetic acid gas.

The acetic acid supply source 431 stores the acetic acid in the liquid state therein. Further, to the acetic acid supply source 431, a nitrogen gas supply pipe 433 is connected which supplies a nitrogen gas into the acetic acid supply source 431. In the acetic acid supply source 431, supply of the nitrogen gas thereinto causes the acetic acid in the liquid state to vaporize to generate the acetic acid gas. This acetic acid gas is supplied to the acetic acid gas supply pipe 430 using the nitrogen gas as a carrier gas.

The first cleaning apparatus 31 has a configuration without the acetic acid nozzle 220 and its accompanying members 221 to 227 in the first cleaning apparatus 31 in the above embodiment. Further, in the first cleaning apparatus 31, the acetic acid drain pipe 196 in the first cleaning apparatus 31 in the above embodiment is omitted, and an exhaust pipe 434 that vacuums and exhausts the atmosphere inside the cup 194 is connected. Note that the other configuration of the first cleaning apparatus 31 is the same as the configuration of the first cleaning apparatus 31 in the above embodiment, and therefore the description thereof will be omitted.

In this case, the acetic acid is supplied from the acetic acid gas supply pipe 430 to the joint surface $W_J$ of the processing target wafer W in step A3 to remove the oxide film on the bumps on the joint surface $W_J$ of the processing target wafer W. Then, the acetic acid gas after removing the oxide film is exhausted from the exhaust pipe 424. Note that the other steps A1, A2, A4 to A14 are the same as steps A1, A2, A4 to A14 in the above embodiment, and therefore the description thereof will be omitted.

Also in this embodiment, even if the oxide film is formed on the bumps on the joint surface $W_J$ of the processing target wafer W in step A1, the oxide film can be removed with the acetic acid supplied in step A3. This enables appropriate manufacture of products. In addition, it is possible to omit the waste solution disposal of the acetic acid and therefore secure high safety and reduce the manufacturing cost.

Note that the joint surface cleaning apparatus 40 and the non-joint surface cleaning apparatus 41 may have the same configuration as that of the above-described first cleaning apparatus 31 and remove the oxide film on the bumps on the joint surface $W_J$ of the processing target wafer W using the acetic acid in the gaseous state in steps A6 and A10.

Though acetic acid is used as the acid in the first cleaning apparatus 31, the joint surface cleaning apparatus 40, and the non-joint surface cleaning apparatus 41 in the above embodiment, another acid may be used. For example, sulfuric acid, hydrochloric acid, nitric acid or the like may be used.

Further, in the case where the oxide film on the bumps on the joint surface $W_J$ of the processing target wafer W can be surely removed in the first cleaning apparatus 31, the acetic acid nozzles 220 and their accompanying members 221 to 227 in the joint surface cleaning apparatus 40 and the non-joint surface cleaning apparatus 41 may be omitted. Further, in this case, the inspection apparatus 7 may be omitted.

Though the two-fluid nozzles are used as the solvent nozzles 203 in the first cleaning apparatus 31, the second cleaning apparatus 33, the joint surface cleaning apparatus 40, and the non-joint surface cleaning apparatus 41 in the above embodiment, the form of the solvent nozzle 203 is not limited to that in this embodiment, but various nozzles can be used. For example, as the solvent nozzle 203, a nozzle body made by uniting a nozzle that supplies an organic solvent and a nozzle that supplies an inert gas, or a spray nozzle, a jet nozzle, a mega-sonic nozzle may be used. Further, to improve the throughput of the cleaning treatment, for example, a cleaning solution heated to 80° C. may be supplied.

Further, a nozzle that supplies IPA (isopropyl alcohol) may be provided in addition to the solvent nozzle 203 in the first cleaning apparatus 31, the second cleaning apparatus 33, the joint surface cleaning apparatus 40, and the non-joint surface cleaning apparatus 41. In this case, after the processing target wafer W or the supporting wafer S is cleaned with the cleaning solution from the solvent nozzle 203, the cleaning solution on the processing target wafer W or the supporting wafer S is replaced with IPA. This more surely cleans the joint surface $W_J$, $S_J$ of the processing target wafer W or the supporting wafer S.

Though the second holding unit 111 is moved in the vertical direction and the horizontal direction in the separation apparatus 30 in the above embodiment, the first holding unit 110 may be moved in the vertical direction and the horizontal direction. Alternatively, both of the first holding unit 110 and the second holding unit 111 may be moved in the vertical direction and the horizontal direction.

Though the second holding unit 111 is moved in the vertical direction and the horizontal direction in the above separation apparatus 30, the second holding unit 111 may be moved only in the horizontal direction and the moving speed of the second holding unit 111 may be changed. Specifically, the moving speed when the second holding unit 111 starts to move may be set low and then gradually accelerated. The reason why the moving speed of the second holding unit 111 is set low is that at the time when the second holding unit 111 starts to move, the contact area between the processing target wafer W and the supporting wafer S is large and the devices on the processing target wafer W are susceptible to the adhesive G. Thereafter, as the contact area between the processing target wafer W and the supporting wafer S becomes smaller, the devices on the processing target wafer W become less susceptible to the adhesive G, and therefore the moving speed of the second holding unit 111 is gradually accelerated. Also in this case, it is possible to prevent the devices and the supporting wafer S from coming into contact with each other to suppress the damage to the devices.

Though the second holding unit 111 is moved in the vertical direction and the horizontal direction in the separation apparatus 30 in the above embodiment, the second holding unit 111 may be moved only in the horizontal direction, for example, when the distance between the devices on the processing target wafer W and the supporting wafer S is large enough. In this case, it is possible to avoid the contact between the devices and the supporting wafer S and facilitate the control of the movement of the second holding unit 111. Further, the second holding unit 111 may be moved only in the vertical direction to separate the processing target wafer W and the supporting wafer S, or an outer peripheral end portion of the second holding unit 111 may be moved only in the vertical direction to separate the processing target wafer W and the supporting wafer S.

In the separation apparatus 30 in the above embodiment, a cover (not illustrated) that covers the processing space between the first holding unit 110 and the second holding unit 111 may be provided. In this case, the processing space is brought into an atmosphere of an inert gas, thereby making it possible to suppress formation of the oxide film on the predetermined patterns on the joint surface $W_J$ of the processing target wafer W even when the processing target wafer W is subjected to heat processing.

Further, a porous plate (not illustrated) that is movable in the horizontal direction following the second holding unit 111 and supplies an inert gas from a plurality of pores may be provided in the separation apparatus 30 in the above embodiment. In this case, at the time when moving the second holding unit 111 to separate the superposed wafer T the inert gas is supplied to the joint surface $W_J$ of the processing target wafer W which has been exposed by the separation while the porous plate is being moved following the second holding unit 111. This makes it possible to suppress formation of the oxide film on the predetermined patterns on the joint surface $W_J$ of the processing target wafer W even when the processing target wafer W is subjected to heat processing.

Note that though the processing target wafer W and the supporting wafer S are separated with the processing target wafer W arranged on the upper side and the supporting wafer S arranged on the lower side in the separation apparatus 30 in the above embodiment, the upper and lower arrangement of the processing target wafer W and the supporting wafer S may be reversed.

Further, the configuration of the inspection apparatus 7 is not limited to that in the above embodiment. The inspection apparatus 7 can take various configurations as long as it can capture an image of the processing target wafer W and inspect the presence or absence of a residue of the adhesive G and the presence or absence of a residue of the oxide film on the processing target wafer W.

A temperature adjusting device (not illustrated) cooling the processing target wafer W heated in the separation apparatus 30 down to a predetermined temperature may be provided in the separation system 1 in the above embodiment. In this case, since the temperature of the processing target wafer W is adjusted to an appropriate temperature, subsequent processing can be more smoothly performed.

Figure 25:
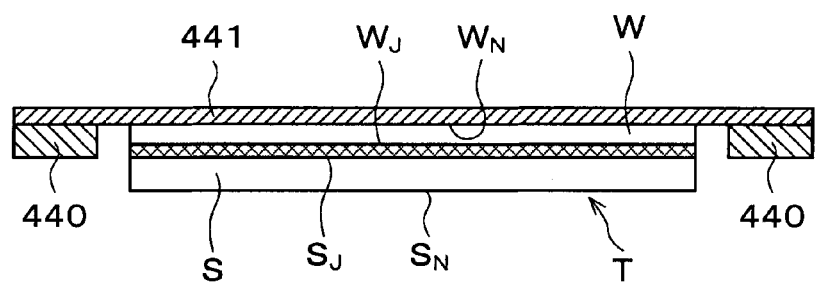
FIG. 25 A longitudinal sectional view of the superposed wafer attached to a dicing frame according to another embodiment.
Figure 26:
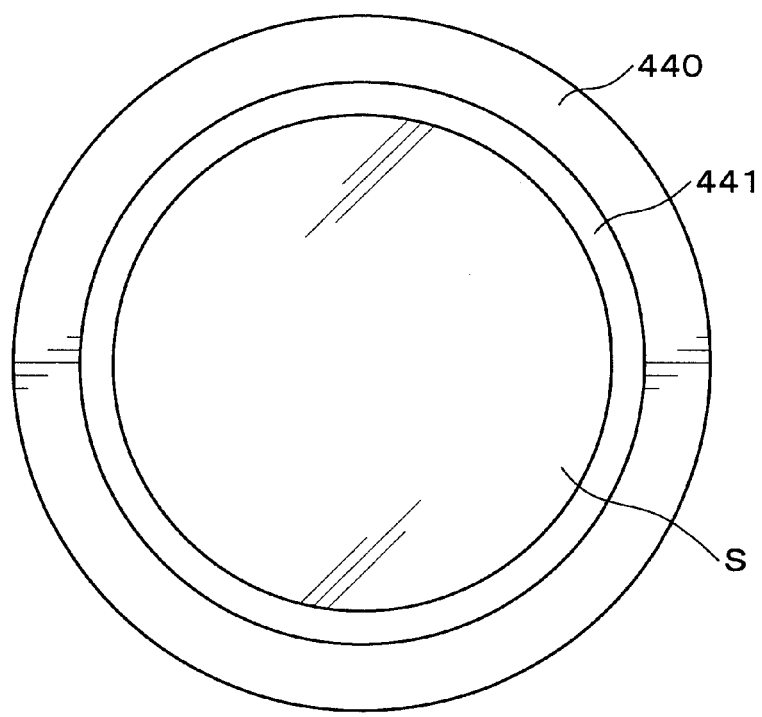
FIG. 26 A plan view of the superposed wafer (supporting wafer) attached to the dicing frame according to another embodiment.

Next, another embodiment will be described. Note that the description of the same portions as those in the above embodiment will be omitted. In this embodiment, the same processing is performed in the separation system 1 not on the above-described superposed wafer T but on a superposed wafer T in the state that a protecting member for protecting the superposed wafer T from breakage, for example, a dicing frame 440 is attached to the superposed wafer T as illustrated in FIG. 25. Note that FIG. 25 is a longitudinal sectional view of the superposed wafer T attached to the dicing frame 440. FIG. 26 is a plan view of the dicing frame 440 and the superposed wafer T illustrated in FIG. 25 seen from below. The dicing frame 440 is an annular plate material. As illustrated in FIG. 25, an adhesive tape 441 with the adhesive surface directed downward is bonded to the top surface of the dicing frame 440. To the adhesive surface, the non-joint surface $W_N$ of the processing target wafer W is joined. Carrying out the present invention with the dicing frame 440 joined in this manner makes it possible to prevent breakage of the processing target wafer W in the separation system 1. Note that though the dicing frame 440 has the annular configuration in this embodiment, the outer peripheral portion of the dicing frame 440 may take various forms such as an almost rectangular shape.

In this case, it is only necessary to house the superposed wafer T and the dicing frame 440 joined in advance in the cassette $C_T$ and mount the cassette $C_T$ on the cassette mounting plate 11. Alternatively, it is only necessary to connect an external apparatus (not illustrated) and the separation system 1 and join the superposed wafer T and the dicing frame 440 in the external apparatus, and then perform processing thereon in the separation system 1. Alternatively, a processing apparatus that joins the superposed wafer T and the dicing frame 440 together may be provided in the separation system 1.

When the processing is performed in the separation apparatus 30, the supporting wafer S is separated into a state that the processing target wafer W and the dicing frame 440 are joined together. It is preferable to perform the processing with the processing target wafer W and the dicing frame 440 kept joined together until the end of the processing in the separation system 1. Then, the processing target wafer W and the dicing frame 440 are housed into the cassette $C_W$ while being kept joined together. This makes it possible to prevent breakage of the processing target wafer W. Then, after the processing in the separation system 1 ends, the processing target wafer W and the dicing frame 440 may be separated in the external apparatus (not illustrated).

Though the case of performing processing on the processing target wafer W in the post-processing station 4 into a product has been described in the above embodiment, the present invention is also applicable to the case where a processing target wafer used, for example, in the three-dimensional integration technique is separated from a supporting wafer. Note that the three-dimensional integration technique is the technique responding to the demand for higher integration of semiconductor devices in recent years, which three-dimensionally stacks a plurality of highly integrated semiconductor devices instead of arranging the highly integrated semiconductor devices within a horizontal surface. Also in this three-dimensional integration technique, the reduction in thickness of the processing target wafers to be stacked is required, and the processing target wafer is joined with the supporting wafer and subjected to the predetermined processing.

Preferred embodiments of the present invention have been described above with reference to the accompanying drawings, but the present invention is not limited to the embodiments. It should be understood that various changes and modifications are readily apparent to those skilled in the art within the scope of the technical spirit as set forth in claims, and those should also be covered by the technical scope of the present invention. The present invention is not limited to the embodiments but can take various forms. The present invention is also applicable to the case where the substrate is a substrate other than the wafer, such as an FPD (Flat Panel Display), a mask reticle for a photomask or the like.

EXPLANATION OF CODES 1 separation system
7 inspection apparatus
30 separation apparatus 31 first cleaning apparatus
32 second transfer apparatus
40 joint surface cleaning apparatus
41 non-joint surface cleaning apparatus
42 reversing apparatus
194 cup
203 solvent nozzle
220 acetic acid nozzle
350 control unit
400 rust inhibitor nozzle
410 alkali supply pipe
420 alkali nozzle
430 acetic acid gas supply pipe
G adhesive
S supporting wafer
T superposed wafer
W processing target wafer

What is claimed:

1. A separation system that separates a superposed substrate in which a processing target substrate and a supporting substrate are joined together with an adhesive, to the processing target substrate and the supporting substrate, comprising:
   a control unit, the control unit is configured to
      control a separation apparatus to separate the superposed substrate to the processing target substrate and the supporting substrate while heating the superposed substrate;
      control a solvent supplying unit to remove the adhesive on a surface of the processing target substrate by supplying an organic solvent to the surface of the processing target substrate separated by the separation apparatus;
      inspect for the presence or absence of the adhesive; and
      control an acid supplying unit to remove an oxide film formed on a predetermined pattern on the surface of the processing target substrate by supplying acid to the surface of the processing target substrate from which the adhesive has been removed by the solvent supplying unit,
   wherein the control unit controls the solvent supplying unit to supply the organic solvent before the acid supplying unit supplies acid.

2. The separation system according to claim 1, wherein the control unit is further configured to
   control an inspection apparatus to inspect the processing target substrate from which the oxide film has been removed by the acid supplying unit.

3. The separation system according to claim 2, wherein the control unit is further configured to
   control another acid supplying unit to remove the oxide film formed on the predetermined pattern on the surface of the processing target substrate by supplying the acid to the surface of the processing target substrate when it is verified by the inspection apparatus that the oxide film remains on the predetermined pattern on the surface of the processing target substrate.

4. The separation system according to claim 1, wherein the control unit is further configured to
   control a rust inhibitor supplying unit to supply a rust inhibitor to the surface of the processing target substrate from which the oxide film has been removed by the acid supplying unit.

5. The separation system according to claim 1, wherein the acid is acetic acid.

6. The separation system according to claim 1, wherein the acid is an aqueous solution having a predetermined concentration or more.

7. The separation system according to claim 6, wherein the control unit is further configured to
   control an alkali supplying unit that neutralizes a waste solution of the acid to supply an alkali solution.

8. The separation system according to claim 7, wherein the alkali supplying unit supplies the alkali solution to a recovery unit that recovers the waste solution of the acid.

9. The separation system according to claim 7, wherein the alkali supplying unit supplies the alkali solution to the surface of the processing target substrate.

10. The separation system according to claim 1, wherein the acid is in a gaseous state.

11. A separation system that separates a superposed substrate in which a processing target substrate and a supporting substrate are joined together with an adhesive, to the processing target substrate and the supporting substrate, comprising:
    a control unit, the control unit is configured to
       control a separation apparatus to separate the superposed substrate to the processing target substrate and the supporting substrate while heating the superposed substrate;
       control a solvent supplying unit to remove the adhesive on a surface of the processing target substrate by supplying an organic solvent to the surface of the processing target substrate separated by the separation apparatus; and
       control an acid supplying unit to remove an oxide film formed on a predetermined pattern on the surface of the processing target substrate by supplying acid to the surface of the processing target substrate from which the adhesive has been removed by the solvent supplying unit,
    wherein the acid is an aqueous solution having a predetermined concentration or more,
    wherein the control unit is further configured to
       control an alkali supplying unit that neutralizes a waste solution of the acid to supply an alkali solution, wherein the alkali supplying unit supplies the alkali solution to the surface of the processing target substrate.

* * * * *